(12) United States Patent
Magia et al.

(10) Patent No.: US 9,269,446 B1
(45) Date of Patent: Feb. 23, 2016

(54) METHODS TO IMPROVE PROGRAMMING OF SLOW CELLS

(71) Applicant: SanDisk Technologies Inc., Plano, TX (US)

(72) Inventors: Sagar Magia, Milpitas, CA (US); Jagdish Sabde, Fremont, CA (US); Jayavel Pachamuthu, San Jose, CA (US); Ankitkumar Babariya, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/681,653

(22) Filed: Apr. 8, 2015

(51) Int. Cl.
G11C 16/04 (2006.01)
G11C 16/06 (2006.01)
G11C 16/10 (2006.01)
G11C 16/34 (2006.01)

(52) U.S. Cl.
CPC ............ *G11C 16/10* (2013.01); *G11C 16/3459* (2013.01)

(58) Field of Classification Search
CPC .......................... G11C 16/10; G11C 16/3459
USPC ............. 365/185.12, 185.17, 185.19, 185.24
See application file for complete search history.

(56) References Cited

U.S. PATENT DOCUMENTS

| | | |
|---|---|---|
| 3,710,348 A | 1/1973 | Craft |
| 3,895,360 A | 7/1975 | Cricchi et al. |
| 4,357,685 A | 11/1982 | Daniele et al. |
| 4,426,688 A | 1/1984 | Moxley |
| 4,720,815 A | 1/1988 | Ogawa |
| 4,757,477 A | 7/1988 | Nagayama et al. |
| 5,070,032 A | 12/1991 | Yuan et al. |
| 5,095,344 A | 3/1992 | Harari |
| 5,172,338 A | 12/1992 | Mehrotra et al. |
| 5,200,959 A | 4/1993 | Gross et al. |
| 5,270,979 A | 12/1993 | Harari et al. |
| 5,313,421 A | 5/1994 | Guterman et al. |
| 5,315,541 A | 5/1994 | Harari et al. |

(Continued)

FOREIGN PATENT DOCUMENTS

| | | |
|---|---|---|
| CN | 1549133 A | 11/2004 |
| CN | 101421797 A | 4/2009 |

(Continued)

OTHER PUBLICATIONS

"Numonyx Sector-Based Compact File System (SCFS) Software is a Feature-Rich Flash Solution," Numonyx, Nov. 3, 2009, 2 pages.

(Continued)

*Primary Examiner* — Tha-O H Bui
(74) *Attorney, Agent, or Firm* — Davis Wright Tremaine LLP

(57) ABSTRACT

For a non-volatile memory device having a NAND type of architecture, techniques are presented for determining NAND strings that are slow to program. These techniques are particularly applicable to memory devices have a 3D structure, such as of BiCS type, where the slow programming can arise from defects of the spacing between the memory holes, in which the NAND strings are formed, and the local interconnects, such as for connecting common source lines and which run in a vertical direction between groups of NAND strings. The slow to program NAND strings can be recorded and this information can be used when writing data to the NAND strings. Several methods of writing data along a word line that includes such slow to program cells are described.

21 Claims, 20 Drawing Sheets

(56) References Cited

U.S. PATENT DOCUMENTS

| | | |
|---|---|---|
| 5,343,063 A | 8/1994 | Yuan et al. |
| 5,380,672 A | 1/1995 | Yuan et al. |
| 5,386,390 A | 1/1995 | Okitaka |
| 5,418,752 A | 5/1995 | Harari et al. |
| 5,428,621 A | 6/1995 | Mehrotra et al. |
| 5,430,679 A | 7/1995 | Hiltebeitel et al. |
| 5,430,859 A | 7/1995 | Norman et al. |
| 5,442,748 A | 8/1995 | Chang et al. |
| 5,479,370 A | 12/1995 | Furuyama et al. |
| 5,485,425 A | 1/1996 | Iwai et al. |
| 5,570,315 A | 10/1996 | Tanaka et al. |
| 5,595,924 A | 1/1997 | Yuan et al. |
| 5,602,987 A | 2/1997 | Harari et al. |
| 5,642,312 A | 6/1997 | Harari |
| 5,657,332 A | 8/1997 | Auclair et al. |
| 5,661,053 A | 8/1997 | Yuan |
| 5,663,901 A | 9/1997 | Wallace et al. |
| 5,699,300 A | 12/1997 | Akamatsu et al. |
| 5,712,180 A | 1/1998 | Guterman et al. |
| 5,768,192 A | 6/1998 | Eitan |
| 5,774,397 A | 6/1998 | Endoh et al. |
| 5,783,958 A | 7/1998 | Lysinger |
| 5,822,245 A | 10/1998 | Gupta et al. |
| 5,848,009 A | 12/1998 | Lee et al. |
| 5,862,080 A | 1/1999 | Harari et al. |
| 5,890,192 A | 3/1999 | Lee et al. |
| 5,903,495 A | 5/1999 | Takeuchi et al. |
| 5,930,167 A | 7/1999 | Lee et al. |
| 5,936,971 A | 8/1999 | Harari et al. |
| 6,011,725 A | 1/2000 | Eitan |
| 6,021,463 A | 2/2000 | Belser |
| 6,038,167 A | 3/2000 | Miwa et al. |
| 6,038,184 A | 3/2000 | Naritake |
| 6,046,935 A | 4/2000 | Takeuchi et al. |
| 6,091,666 A | 7/2000 | Arase et al. |
| 6,134,148 A | 10/2000 | Kawahara et al. |
| 6,151,248 A | 11/2000 | Harari et al. |
| 6,222,762 B1 | 4/2001 | Guterman et al. |
| 6,230,233 B1 | 5/2001 | Lofgren et al. |
| 6,252,800 B1 | 6/2001 | Chida |
| 6,266,273 B1 | 7/2001 | Conley et al. |
| 6,282,624 B1 | 8/2001 | Kimura et al. |
| 6,353,553 B1 | 3/2002 | Tamada et al. |
| 6,426,893 B1 | 7/2002 | Conley et al. |
| 6,456,528 B1 | 9/2002 | Chen |
| 6,480,423 B2 | 11/2002 | Toda et al. |
| 6,510,488 B2 | 1/2003 | Lasser |
| 6,512,263 B1 | 1/2003 | Yuan |
| 6,522,580 B2 | 2/2003 | Chen et al. |
| 6,523,132 B1 | 2/2003 | Harari et al. |
| 6,560,146 B2 | 5/2003 | Cernea |
| 6,581,142 B1 | 6/2003 | Jacobs |
| 6,594,177 B2 | 7/2003 | Matarrese et al. |
| 6,657,891 B1 | 12/2003 | Shibata et al. |
| 6,771,536 B2 | 8/2004 | Li et al. |
| 6,813,184 B2 | 11/2004 | Lee |
| 6,853,596 B2 | 2/2005 | Cheung |
| 6,870,768 B2 | 3/2005 | Cernea |
| 6,967,873 B2 | 11/2005 | Hamilton et al. |
| 6,990,018 B2 | 1/2006 | Tanaka et al. |
| 6,996,017 B2 | 2/2006 | Scheuerlein et al. |
| 7,027,330 B2 | 4/2006 | Park |
| 7,039,781 B2 | 5/2006 | Iwata et al. |
| 7,057,939 B2 | 6/2006 | Li et al. |
| 7,058,818 B2 | 6/2006 | Dariel |
| 7,076,611 B2 | 7/2006 | Steere et al. |
| 7,110,294 B2 | 9/2006 | Kawaii |
| 7,158,421 B2 | 1/2007 | Li et al. |
| 7,170,802 B2 | 1/2007 | Cernea et al. |
| 7,206,230 B2 | 4/2007 | Li et al. |
| 7,224,605 B1 | 5/2007 | Moogat et al. |
| 7,257,689 B1 | 8/2007 | Baird |
| 7,299,314 B2 | 11/2007 | Lin et al. |
| 7,310,347 B2 | 12/2007 | Lasser |
| 7,345,928 B2 | 3/2008 | Li |
| 7,405,985 B2 | 7/2008 | Cernea et al. |
| 7,411,846 B2 | 8/2008 | Terzioglu |
| 7,420,847 B2 | 9/2008 | Li |
| 7,426,623 B2 | 9/2008 | Lasser |
| 7,447,070 B2 | 11/2008 | Cernea |
| 7,490,283 B2 | 2/2009 | Gorobets et al. |
| 7,493,457 B2 | 2/2009 | Murin |
| 7,502,254 B2 | 3/2009 | Murin et al. |
| 7,502,259 B2 | 3/2009 | Gorobets |
| 7,961,512 B2 | 6/2011 | Li et al. |
| 7,986,554 B2 | 7/2011 | Li |
| 8,027,195 B2 | 9/2011 | Li et al. |
| 8,040,744 B2 | 10/2011 | Gorobets et al. |
| 8,054,684 B2 | 11/2011 | Gorobets et al. |
| 8,094,500 B2 | 1/2012 | Paley et al. |
| 8,144,512 B2 | 3/2012 | Huang et al. |
| 8,244,960 B2 | 8/2012 | Paley et al. |
| 8,379,454 B2 | 2/2013 | Kochar et al. |
| 8,565,019 B2 | 10/2013 | Honda et al. |
| 8,700,840 B2 | 4/2014 | Paley et al. |
| 8,913,446 B2 | 12/2014 | Harada |
| 8,933,516 B1 | 1/2015 | Wu et al. |
| 2001/0000023 A1 | 3/2001 | Kawahara et al. |
| 2002/0118574 A1 | 8/2002 | Gongwer et al. |
| 2003/0182317 A1 | 9/2003 | Kahn et al. |
| 2003/0223274 A1 | 12/2003 | Cernea |
| 2004/0060031 A1 | 3/2004 | Cernea |
| 2004/0109357 A1 | 6/2004 | Cernea et al. |
| 2005/0073884 A1 | 4/2005 | Gonzalez et al. |
| 2005/0083735 A1* | 4/2005 | Chen ............... G11C 11/5628 365/185.17 |
| 2005/0141387 A1 | 6/2005 | Cernea et al. |
| 2005/0144360 A1 | 6/2005 | Bennett et al. |
| 2005/0144365 A1 | 6/2005 | Gorobets et al. |
| 2005/0213393 A1 | 9/2005 | Lasser |
| 2006/0114726 A1 | 6/2006 | Kozakai et al. |
| 2006/0126390 A1 | 6/2006 | Gorobets et al. |
| 2006/0136656 A1 | 6/2006 | Conley et al. |
| 2006/0161728 A1 | 7/2006 | Bennett et al. |
| 2007/0061502 A1 | 3/2007 | Lasser et al. |
| 2007/0065119 A1 | 3/2007 | Pomerantz |
| 2007/0091677 A1 | 4/2007 | Lasser et al. |
| 2007/0103977 A1 | 5/2007 | Conley et al. |
| 2007/0159652 A1 | 7/2007 | Sato |
| 2007/0180346 A1 | 8/2007 | Murin |
| 2007/0186032 A1 | 8/2007 | Sinclair et al. |
| 2007/0211530 A1 | 9/2007 | Nakano |
| 2007/0220197 A1 | 9/2007 | Lasser |
| 2007/0237006 A1 | 10/2007 | Murin et al. |
| 2007/0260808 A1 | 11/2007 | Raines et al. |
| 2007/0268745 A1 | 11/2007 | Lasser |
| 2007/0283081 A1 | 12/2007 | Lasser |
| 2007/0285980 A1 | 12/2007 | Shimizu et al. |
| 2008/0002467 A1 | 1/2008 | Tsuji |
| 2008/0082736 A1 | 4/2008 | Chow et al. |
| 2008/0104309 A1 | 5/2008 | Cheon et al. |
| 2008/0104312 A1 | 5/2008 | Lasser |
| 2008/0112238 A1 | 5/2008 | Kim et al. |
| 2008/0147996 A1 | 6/2008 | Jenkins et al. |
| 2008/0159012 A1 | 7/2008 | Kim |
| 2008/0181000 A1 | 7/2008 | Lasser |
| 2008/0209112 A1 | 8/2008 | Yu et al. |
| 2008/0244338 A1 | 10/2008 | Mokhlesi et al. |
| 2008/0244367 A1 | 10/2008 | Chin et al. |
| 2008/0250220 A1 | 10/2008 | Ito et al. |
| 2008/0250300 A1 | 10/2008 | Mokhlesi et al. |
| 2008/0253181 A1* | 10/2008 | Edahiro ............. G11C 16/3418 365/185.03 |
| 2008/0279005 A1 | 11/2008 | France |
| 2008/0294814 A1 | 11/2008 | Gorobets |
| 2008/0301532 A1 | 12/2008 | Uchikawa et al. |
| 2008/0307192 A1 | 12/2008 | Sinclair et al. |
| 2008/0310224 A1 | 12/2008 | Roohparvar et al. |
| 2009/0067244 A1 | 3/2009 | Li et al. |
| 2009/0089481 A1 | 4/2009 | Kapoor et al. |
| 2009/0089482 A1 | 4/2009 | Traister |
| 2009/0089520 A1 | 4/2009 | Saha et al. |
| 2009/0094482 A1 | 4/2009 | Zilberman |
| 2009/0172247 A1 | 7/2009 | Bar-Or et al. |

(56) References Cited

U.S. PATENT DOCUMENTS

| | | |
|---|---|---|
| 2009/0172498 A1 | 7/2009 | Shlick et al. |
| 2009/0310408 A1 | 12/2009 | Lee et al. |
| 2010/0037012 A1 | 2/2010 | Yano et al. |
| 2010/0107004 A1 | 4/2010 | Bottelli et al. |
| 2010/0157641 A1 | 6/2010 | Shalvi et al. |
| 2010/0172179 A1 | 7/2010 | Gorobets et al. |
| 2010/0172180 A1 | 7/2010 | Paley et al. |
| 2010/0174845 A1 | 7/2010 | Gorobets et al. |
| 2010/0174846 A1 | 7/2010 | Paley et al. |
| 2010/0174847 A1 | 7/2010 | Paley et al. |
| 2010/0287217 A1 | 11/2010 | Borchers et al. |
| 2010/0325351 A1 | 12/2010 | Bennett |
| 2010/0329007 A1 | 12/2010 | Chibvongodze et al. |
| 2011/0063909 A1 | 3/2011 | Komatsu |
| 2011/0096601 A1 | 4/2011 | Gavens et al. |
| 2011/0099460 A1 | 4/2011 | Dusija et al. |
| 2011/0153913 A1 | 6/2011 | Huang et al. |
| 2011/0292724 A1* | 12/2011 | Kim ............... G11C 16/0483 365/185.03 |

FOREIGN PATENT DOCUMENTS

| | | |
|---|---|---|
| JP | 61-292747 | 12/1986 |
| JP | 01-128297 | 5/1989 |
| JP | 06-150666 | 5/1994 |
| WO | 98-44420 A1 | 10/1998 |
| WO | 00-49488 A1 | 8/2000 |
| WO | 03-025939 A2 | 3/2003 |
| WO | 2006-064318 A1 | 6/2006 |
| WO | 2007-141783 A1 | 12/2007 |

OTHER PUBLICATIONS

"SanDisk, Toshiba Develop 32-Nanometer NAND Flash Technology," SanDisk Corporation and Toshiba Corporation, Feb. 11, 2009, www.physorg.com/news153597019.html, 9 pages.

Chang et al., "Real-Time Garbage Collection for Flash-Memory Storage Systems of Real-Time Embedded Systems," Nov. 2004, ACM, ACM Transactions on Embedded Computing Systems, vol. 3, pp. 837-863.

Choudhuri et al., "Performance Improvement of Block Based NAND Flash Translation Layer," Codes + ISSS '07, Salzburg, Austria, Sep. 2007, pp. 257-262.

Eitan et al., "NROM: A Novel Localized Trapping, 2-Bit Nonvolatile Memory Cell," IEEE Electron Device Letters, vol. 21, No. 11, Nov. 2000, pp. 543-545.

Im et al., "Storage Architecture and Software Support for SLC/MLC Combined Flash Memory," Mar. 2009, ACM, SAC'09, pp. 1664-1669.

Kang et al., "A Superblock-Based Flash Translation Layer for NAND Flash Memory," EMSOFT'06, Oct. 2006, pp. 161-170.

Lee et al., "Block Recycling Schemes and Their Cost-Based Optimization in NAND Flash Memory Based Storage System," Oct. 2007, ACM., EMSOFT '07, pp. 174-182.

Raz et al., "Implementing MLC NAND Flash for Cost-Effective, High-Capacity Memory," Sep. 2003., M-Systems, 13 pages.

* cited by examiner

Programming into four states represented by a 2-bit code

METHODS TO IMPROVE PROGRAMMING OF SLOW CELLS

BACKGROUND

This application relates to the operation of re-programmable non-volatile memory systems such as semiconductor flash memory that record data using charge stored in charge storage elements of memory cells.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. For example, a nonvolatile memory cell may have a trapping dielectric sandwiched between two silicon dioxide layers. Multi-state data storage is implemented by separately reading the binary states of the spatially separated charge storage regions within the dielectric.

SUMMARY

Methods are presented for the operating of a non-volatile memory circuit having an array of a plurality of programmable memory cells formed along bit lines and word line, the method including maintaining a record of memory cells of the array that are slow to program and performing a programming operation for memory cells on a selected word line. The programming operation includes determining from the record cells on the selecting word line that are slow to program and applying a pulse on the selected word line. Prior to applying the pulse on the selected word line, the bit lines corresponding to the memory cells along the selected word line are biased, where the biasing including: for memory cells along the selected word line not to be programmed, setting a programming inhibit voltage on the corresponding bit lines; for memory cells along the selected word line that are to be programmed and that are not slow to program memory cells, setting a program enable voltage on the corresponding bit lines; and, for slow to program memory cells along the selected word line that are to be programmed, setting an enhanced program enable voltage on the corresponding bit lines. The program enable voltage is a voltage intermediate to the program inhibit voltage and the enhanced program enable voltage.

Additional methods are presented for operating a non-volatile memory circuit having an array of a plurality of programmable memory cells formed along bit lines and word line, that includes maintaining a record of memory cells of the array that are slow to program and performing a programming operation for memory cells on a selected word line. The programming operation includes determining from the record cells on the selecting word line that are slow to program and biasing the bit lines corresponding to the memory cells along the selected word line, where the biasing includes: for memory cells along the selected word line not to be programmed, setting a programming inhibit voltage on the corresponding bit lines; and, for memory cells along the selected word line that are to be programmed, setting a program enable voltage on the corresponding bit lines. A first pulse on the selected word line, where for slow to program memory cells along the selected word line that are to be programmed, the corresponding bit lines are maintained at the program enable voltage for the duration of the first pulse, and for memory cells along the selected word line that are to be programmed and that are not slow to program memory cells, the corresponding bit lines are switched from the program enable voltage to the program inhibit voltage during the first pulse.

Further of methods are presented for the operation of a non-volatile memory circuit having an array of a plurality of programmable memory cells formed along bit lines and word line that include maintaining a record of memory cells of the array that are slow to program and writing a page of data along a selected word line. The writing of the page of data along the selected word line includes: performing an alternating series pulse and verify operations for the memory cells along the selected word line until the page of data is determined to be successfully written, wherein memory cell along the selected word line that verify as written to a corresponding target state are inhibited from further programming; subsequently determining whether any memory cells along the selected word line that have failed to verify and that are listed in the record as slow to program; and subsequently applying an additional pulse to the selected word line with all of the memory cells inhibited from further programming except the memory cells determined both to be slow to program and to have failed to verify.

In a non-volatile flash memory circuit having an array of memory cells formed according to a NAND type of architecture, a method is presented for determining NAND strings of a block of the array having slow to program memory cells. The memory cells of the NAND strings are formed along word lines and each of the NAND strings of the block connected along a corresponding bit line. A first write operation is performed for memory cells of the block along a first word line corresponding to a first set of a plurality bit lines, but not for memory cells of the block along the first word line corresponding to a second set of one or more bit lines, where the second set of bit lines is distinct from the first set of bit lines. A number of programming pulses used to successfully perform the first write operation is determined. A second write operation is performed for memory cells of the block along the first word line corresponding to the second set of bit lines, but not for memory cells of the block along the first word line corresponding to the first set of bit lines. A number of programming pulses used to successfully the second write operation is determined. A comparison is performed of the number of programming pulses used to successfully perform the first write operation with the number of programming pulses used to successfully perform the second write operation; and based upon the comparison, a determination is performed of whether NAND strings corresponding to the second set of bit lines include memory cells that are slow to program.

In a non-volatile flash memory circuit having an array of memory cells formed according to a NAND type of architecture, a method is presented of determining NAND strings of a block of the array having slow to program memory cells, the memory cells of the NAND strings being formed along word lines and each of the NAND strings of the block connected along a corresponding bit line. A first write operation is performed for a first set of memory cells of the block along a first word line corresponding to a first set of a plurality bit lines, but not for a second set of one or more memory cells of the block along the first word line corresponding to a second set of one or more bit lines, where the second set of bit lines is distinct from the first set of bit lines. An amount of current through the first set of memory cells during the first write operation is determined. A second write operation is performed for the second set of memory cells, but not for the first set of memory cells an amount of current through the second set of memory cells during the second write operation is determined. A comparison is performed of the amount of current through the first set of memory cells during the first write operation with the amount of current through the second set of memory cells during the second write operation; and based upon the comparison, a determination is made of whether NAND strings corresponding to the second set of bit lines include memory cells that are slow to program.

In a non-volatile flash memory circuit having an array of memory cells formed according to a NAND type of architecture, a further method is presented for determining NAND strings of a block of the array having slow to program memory cells, the memory cells of the NAND strings being formed along word lines and each of the NAND strings of the block connected along a corresponding bit line. The memory cells of a first block are programmed and an erase operation is subsequently performed on the first block. A comparison is performed of the level of erasure of memory cells of the first block corresponding to a first set of a plurality bit line relative to the level of erase of memory cells of the first block corresponding to a second set of one or more bit lines, where the second set of bit lines is distinct from the first set of bit lines. Based upon the comparison, a determination is performed of whether NAND strings corresponding to the second set of bit lines include memory cells that are slow to program.

In a non-volatile flash memory circuit having an array of memory cells formed according to a NAND type of architecture, additional methods are described for determining NAND strings of a block of the array having slow to program memory cells, where the memory cells of the NAND strings are formed along word lines and each of the NAND strings of the block is connected along a corresponding bit line. A first number of programming pulses is applied to a first word line of the block with memory cells of the block corresponding to first and second sets of bit lines enabled for programming, the first set of bit lines being a plurality bit lines and the second set of bit lines including one or more bit lines, where the second set of bit lines is distinct from the first set of bit lines. A comparison is subsequently performed of the relative amount of programming of memory cells corresponding to the second set of bit lines with respect to the amount of programming of memory cells corresponding to the first set of bit lines, and, based upon the comparison, a determination is performed of whether NAND strings corresponding to the second set of bit lines include memory cells that are slow to program.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

Figure 1:
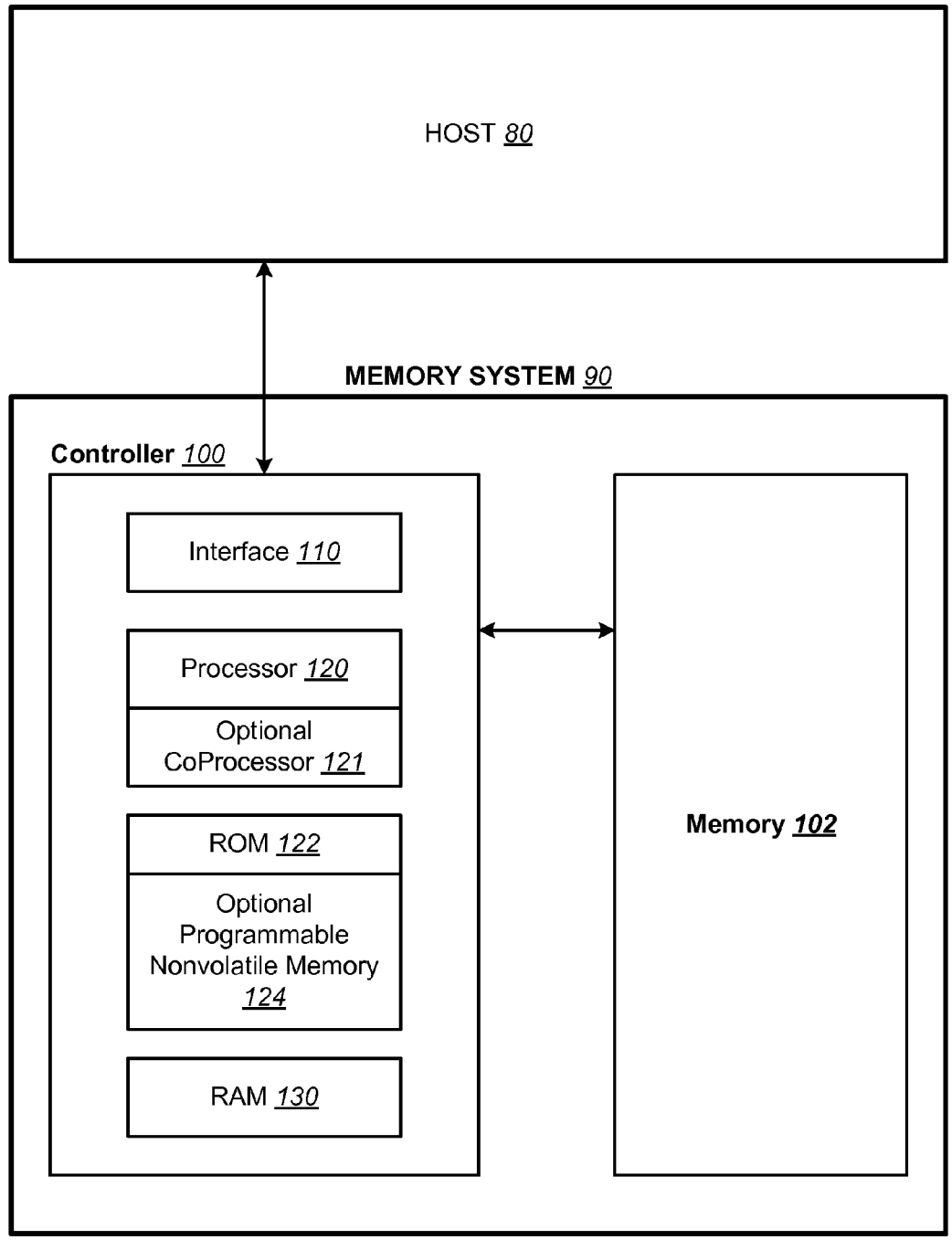
FIG. 1 illustrates schematically the main hardware components of a memory system suitable for implementing various aspects described in the following.

FIG. 1 illustrates schematically the main hardware components of a memory system suitable for implementing the following. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

Figure 2:
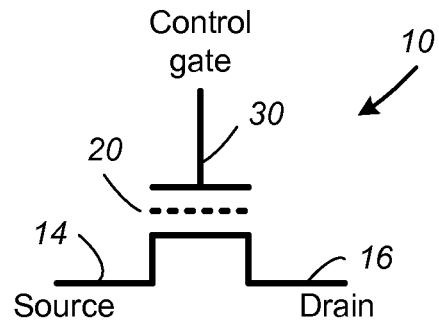
FIG. 2 illustrates schematically a non-volatile memory cell.

It will be recognized that the following is not limited to the two dimensional and three dimensional exemplary structures described but cover all relevant memory structures within the spirit and scope as described herein Physical Memory Structure FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM: Also, examples of memory devices utilizing dielectric storage elements.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range, of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
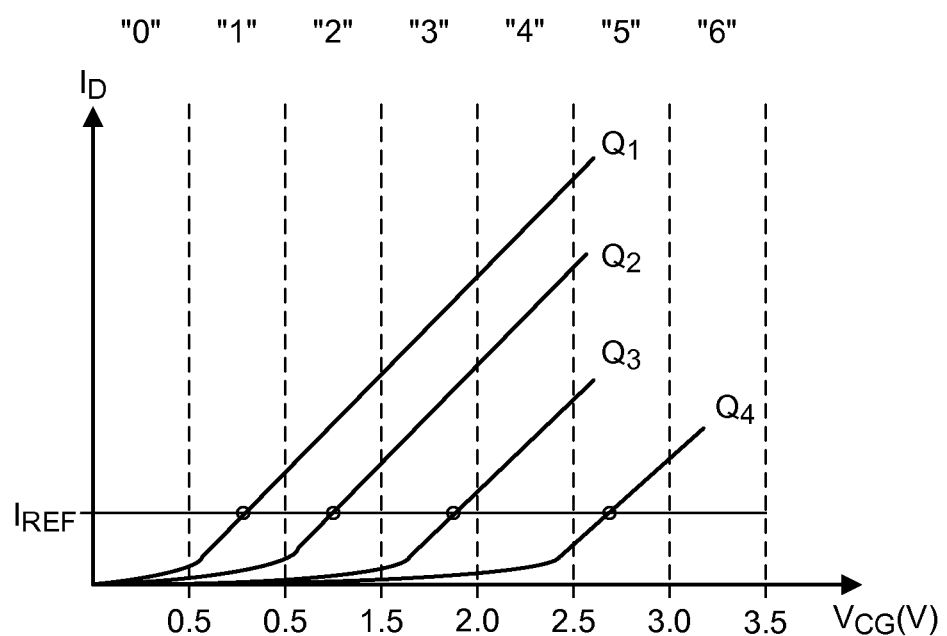
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4:
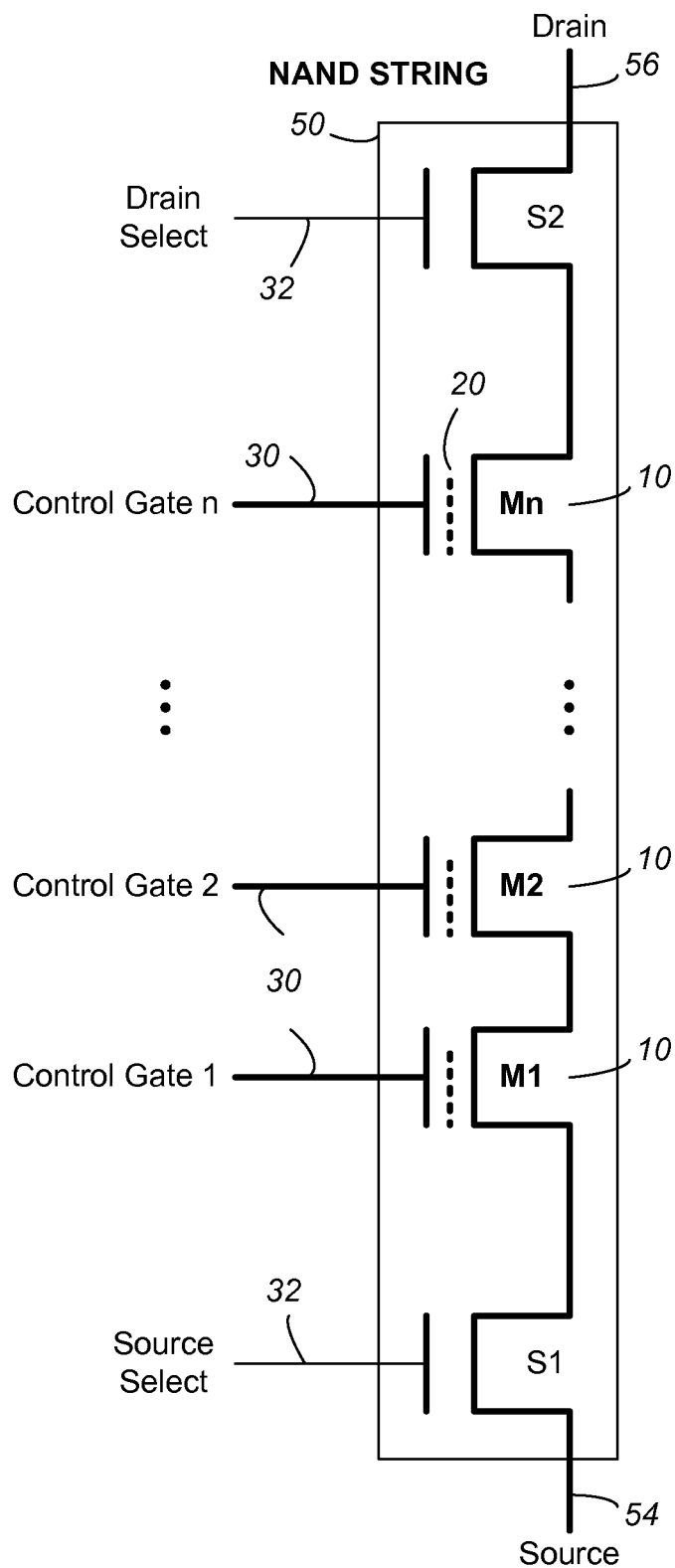
FIG. 4 illustrates schematically a string of memory cells organized into a NAND string.

FIG. 4 illustrates schematically a string of memory cells organized into a NAND string. A NAND string 50 comprises a series of memory transistors M1, M2, ... Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 5). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

FIG. 4B illustrates an example of a NAND array 210 of memory cells, constituted from NAND strings 50 such as that shown in FIG. 4. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
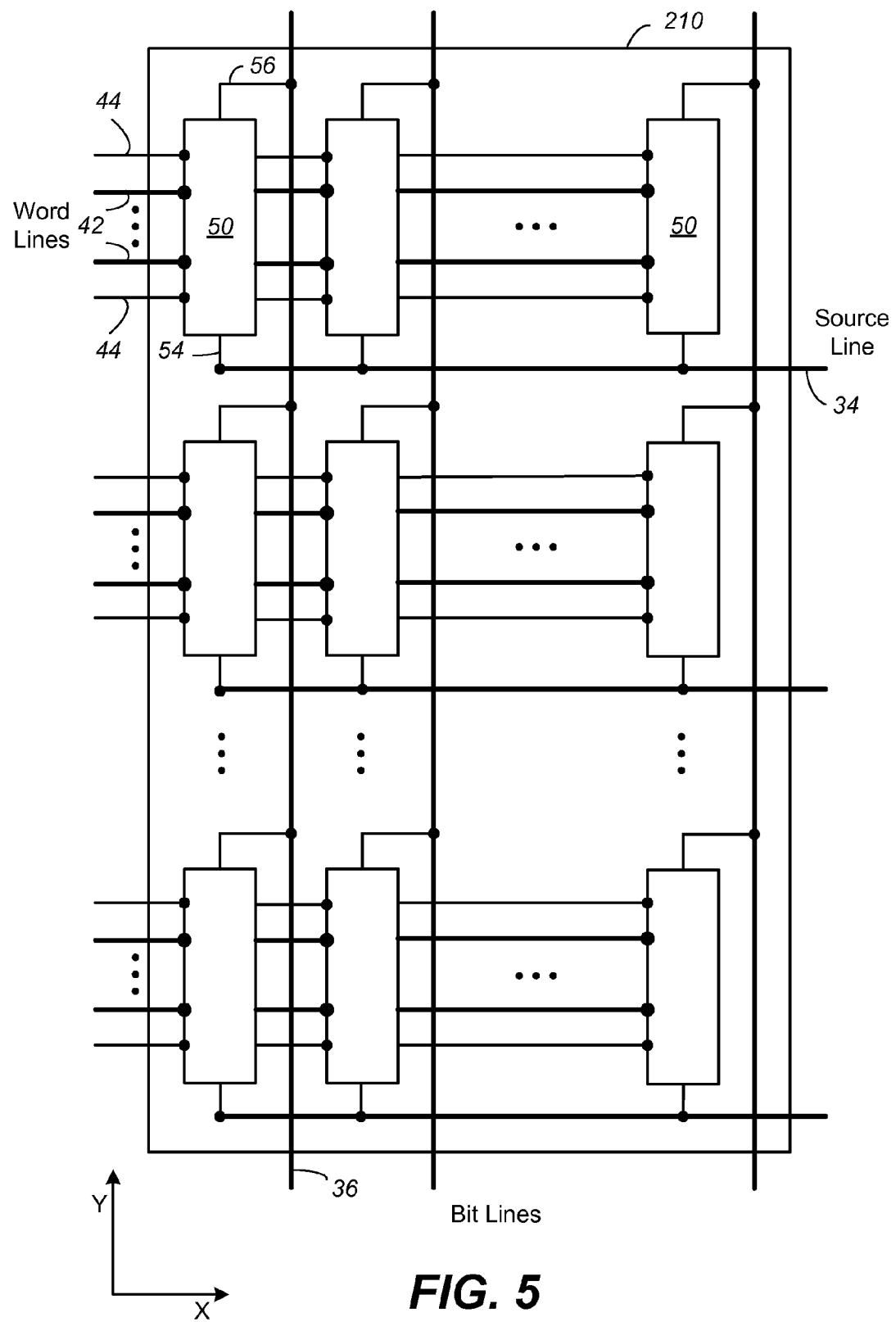
FIG. 5 illustrates an example of a NAND array 210 of memory cells, constituted from NAND strings 50 such as that shown in FIG. 4.
Figure 6:
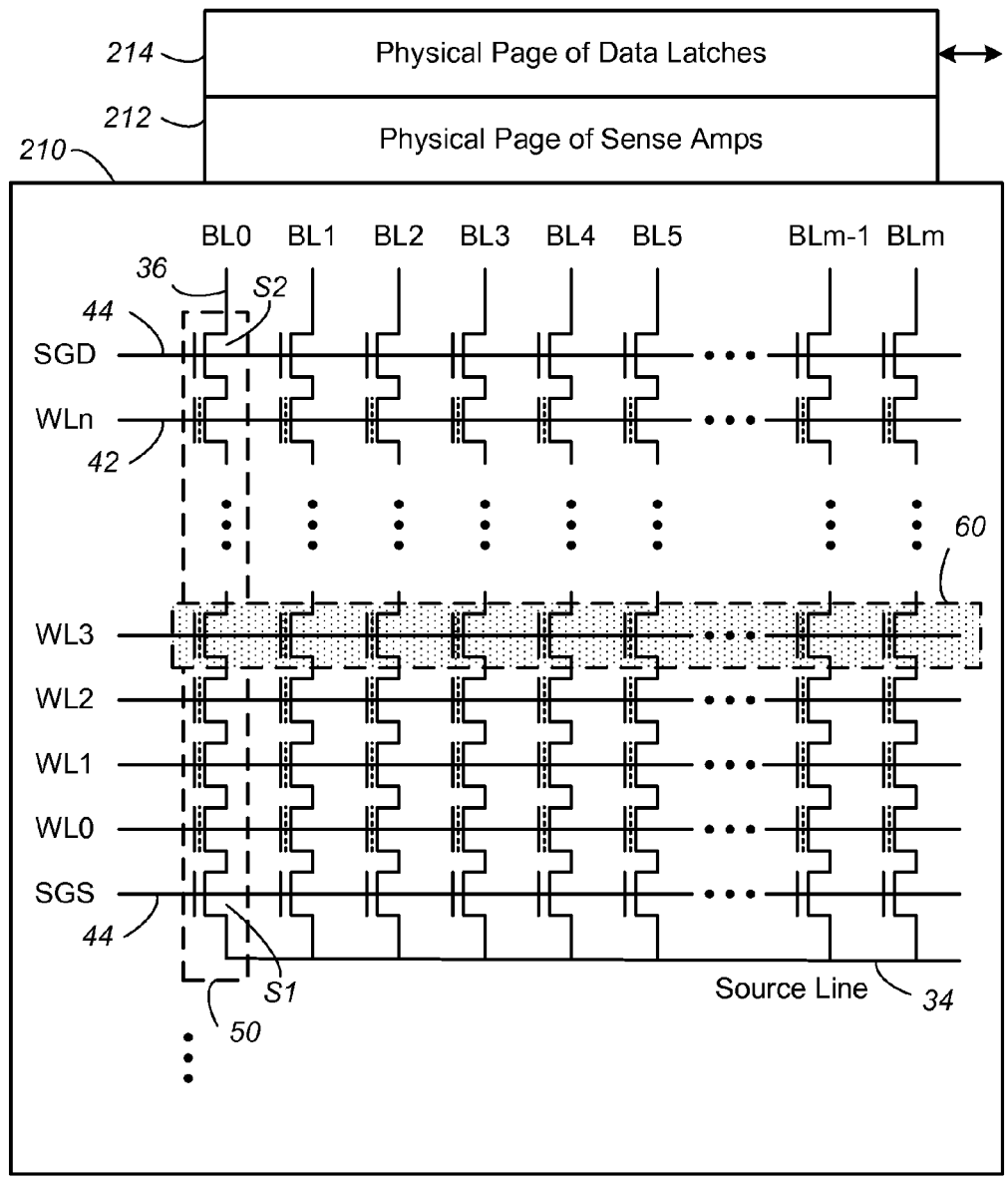
FIG. 6 illustrates a page of memory cells, organized in the NAND configuration, being sensed or programmed in parallel.

FIG. 6 illustrates a page of memory cells, organized in the NAND configuration, being sensed or programmed in parallel. FIG. 6 essentially shows a bank of NAND strings 50 in the memory array 210 of FIG. 5, where the detail of each NAND string is shown explicitly as in FIG. 4. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 7:
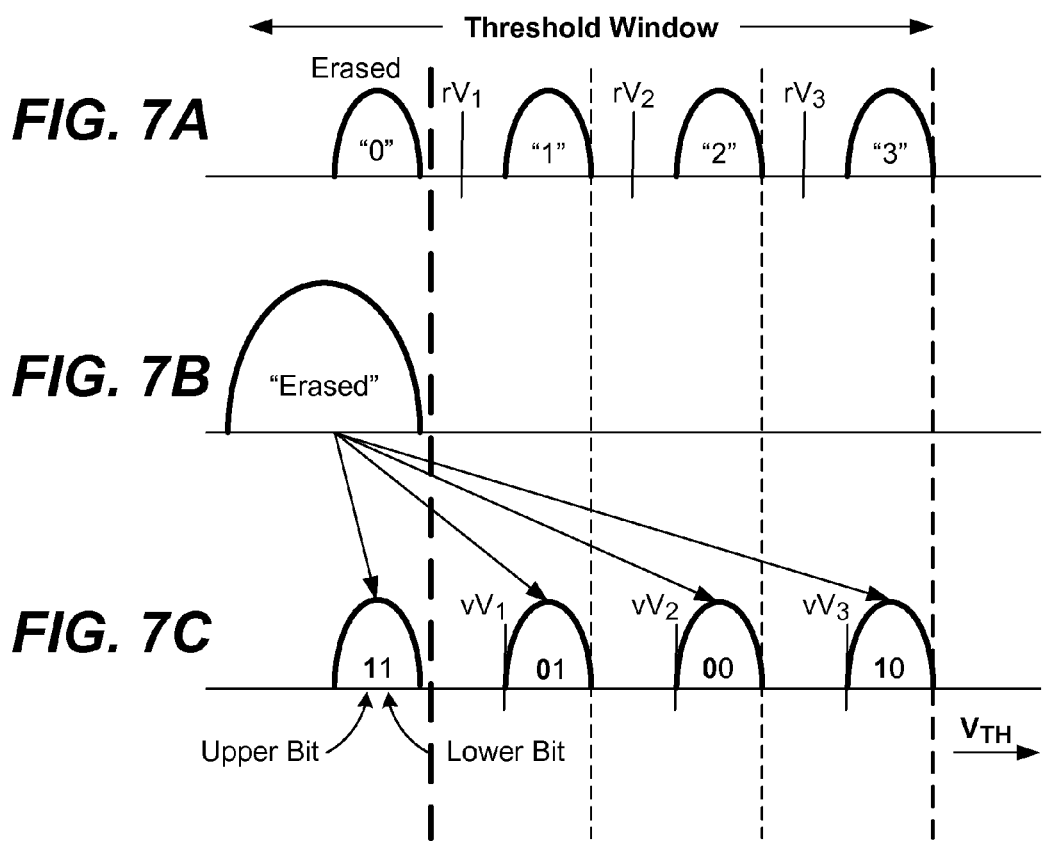
FIGS. 7A-7C illustrate an example of programming a population of memory cells.

FIG. 7A-7C illustrate an example of programming a population of 4-state memory cells. FIG. 7A illustrates the population of memory cells programmable into four distinct distributions of threshold voltages respectively representing memory states "0", "1", "2" and "3". FIG. 7B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 7B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structures

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

Figure 8:
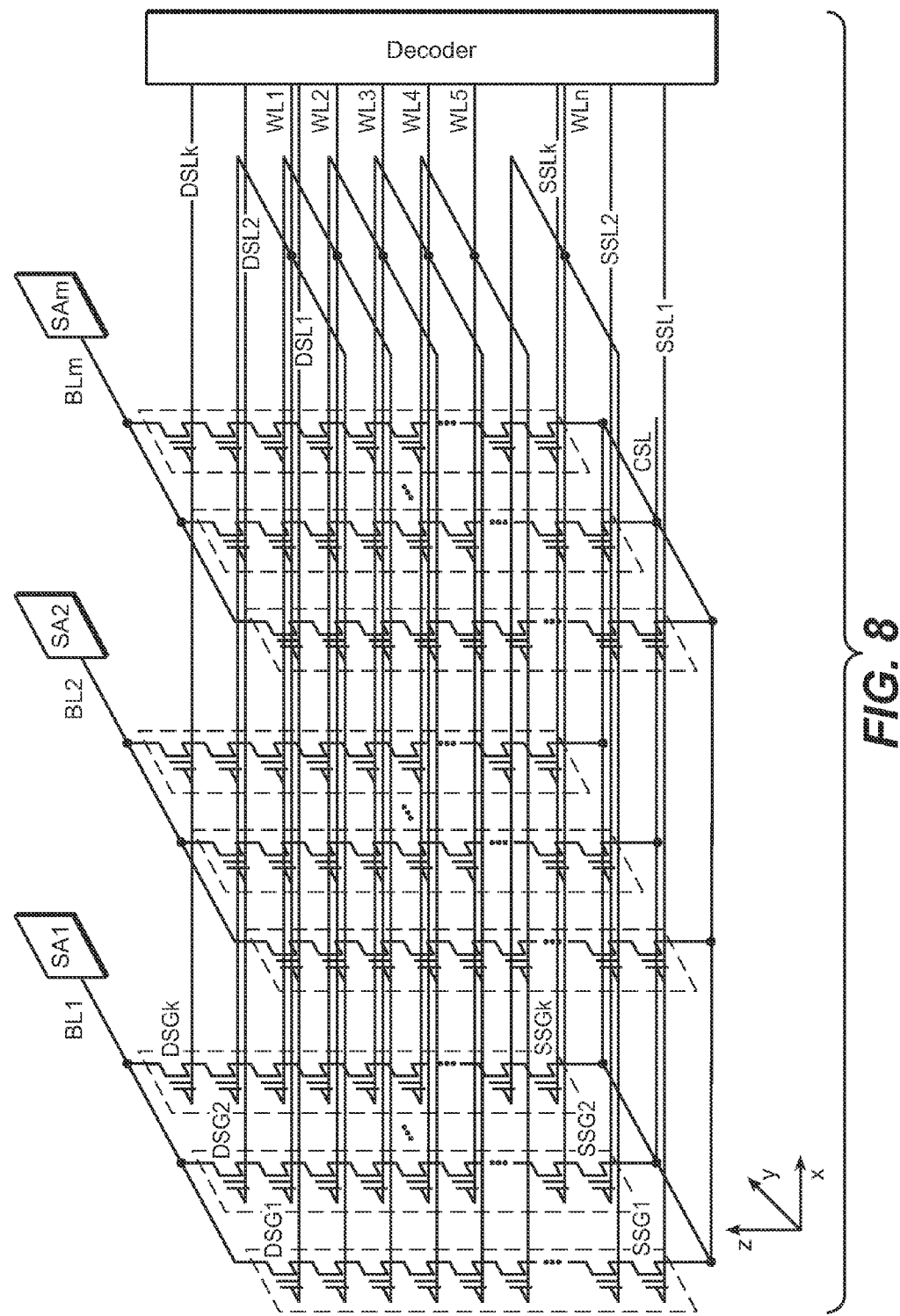
FIG. 8 shows an example of a physical structure of a 3-D NAND string.

FIG. 8 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 8 shows an example of a NAND string that has 32 cells (0-31)

connected in series, the number of cells in a NAND string may be any suitable number. Not all cells are shown for clarity. It will be understood that additional cells are formed where word lines 3-29 (not shown) intersect the local vertical bit line.

A 3D NAND array can, loosely speaking, be formed tilting up the respective structures 50 and 210 of FIGS. 5 and 6 to be perpendicular to the x-y plane. In this example, each y-z plane corresponds to the page structure of FIG. 6, with m such plane at differing x locations. The (global) bit lines, BL1-m, each run across the top to an associated sense amp SA1-m. The word lines, WL1-n, and source and select lines SSL1-n and DSL1-n, then run in x direction, with the NAND string connected at bottom to a common source line CSL.

Figure 9:
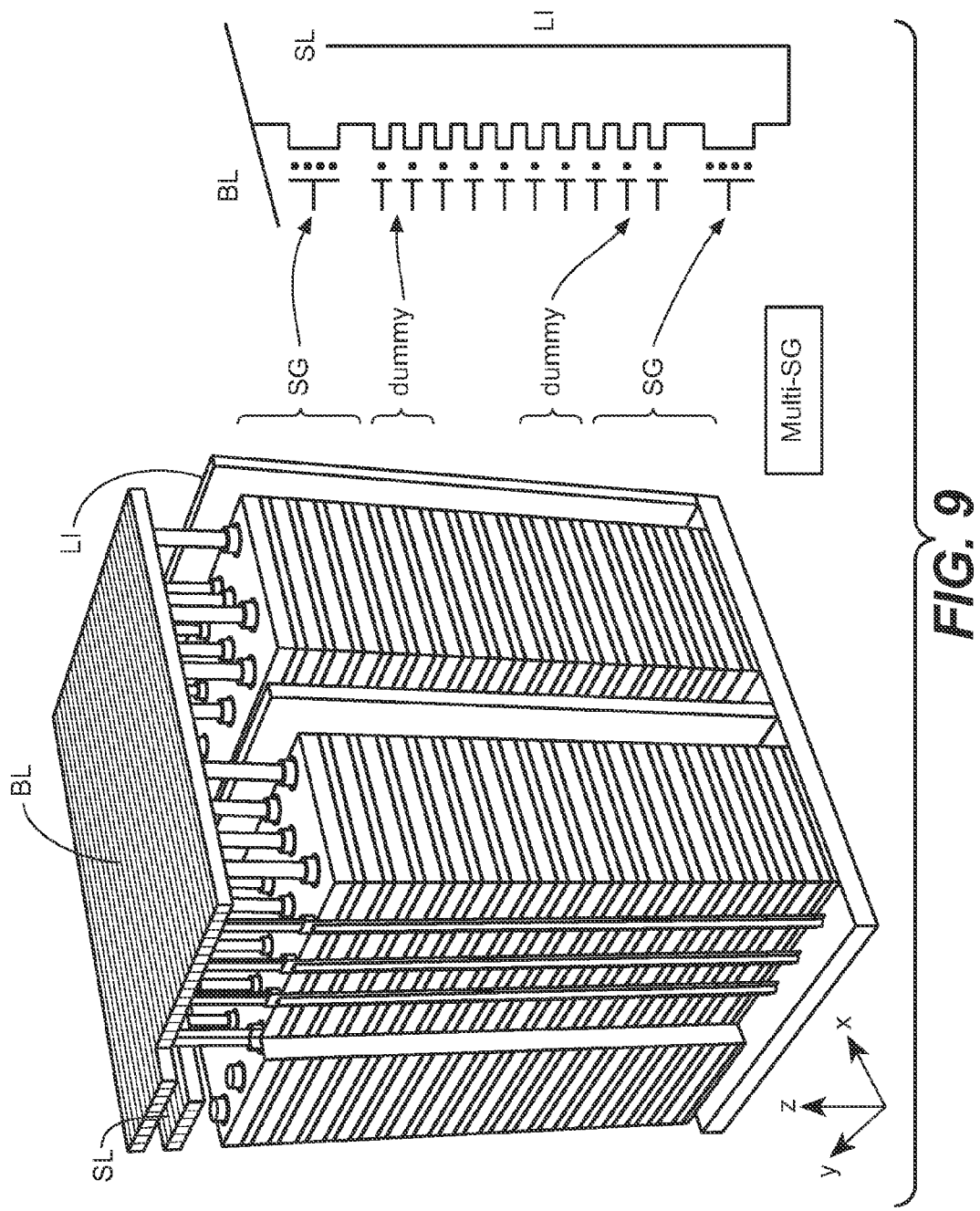
FIGS. 9-12 look at a particular monolithic three dimensional (3D) memory array of the NAND type (more specifically of the "BiCS" type).

FIGS. 9-12 look at a particular monolithic three dimensional (3D) memory array of the NAND type (more specifically of the "BiCS" type), where one or more memory device levels are formed above a single substrate, in more detail. FIG. 9 is an oblique projection of part of such a structure, showing a portion corresponding to two of the page structures in FIG. 5, where, depending on the embodiment, each of these could correspond to a separate block or be different "fingers" of the same block. Here, instead to the NAND strings lying in a common y-z plane, they are squashed together in the y direction, so that the NAND strings are somewhat staggered in the x direction. On the top, the NAND strings are connected along global bit lines (BL) spanning multiple such sub-divisions of the array that run in the x direction. Here, global common source lines (SL) also run across multiple such structures in the x direction and are connect to the sources at the bottoms of the NAND string, which are connected by a local interconnect (LI) that serves as the local common source line of the individual finger. Depending on the embodiment, the global source lines can span the whole, or just a portion, of the array structure. Rather than use the local interconnect (LI), variations can include the NAND string being formed in a U type structure, where part of the string itself runs back up.

To the right of FIG. 9 is a representation of the elements of one of the vertical NAND strings from the structure to the left. Multiple memory cells are connected through a drain select gate SGD to the associated bit line BL at the top and connected through the associated source select gate SDS to the associated local source line LI to a global source line SL. It is often useful to have a select gate with a greater length than that of memory cells, where this can alternately be achieved by having several select gates in series (as described in U.S. patent application Ser. No. 13/925,662, filed on Jun. 24, 2013), making for more uniform processing of layers. Additionally, the select gates are programmable to have their threshold levels adjusted. This exemplary embodiment also includes several dummy cells at the ends that are not used to store user data, as their proximity to the select gates makes them more prone to disturbs.

Figure 10:
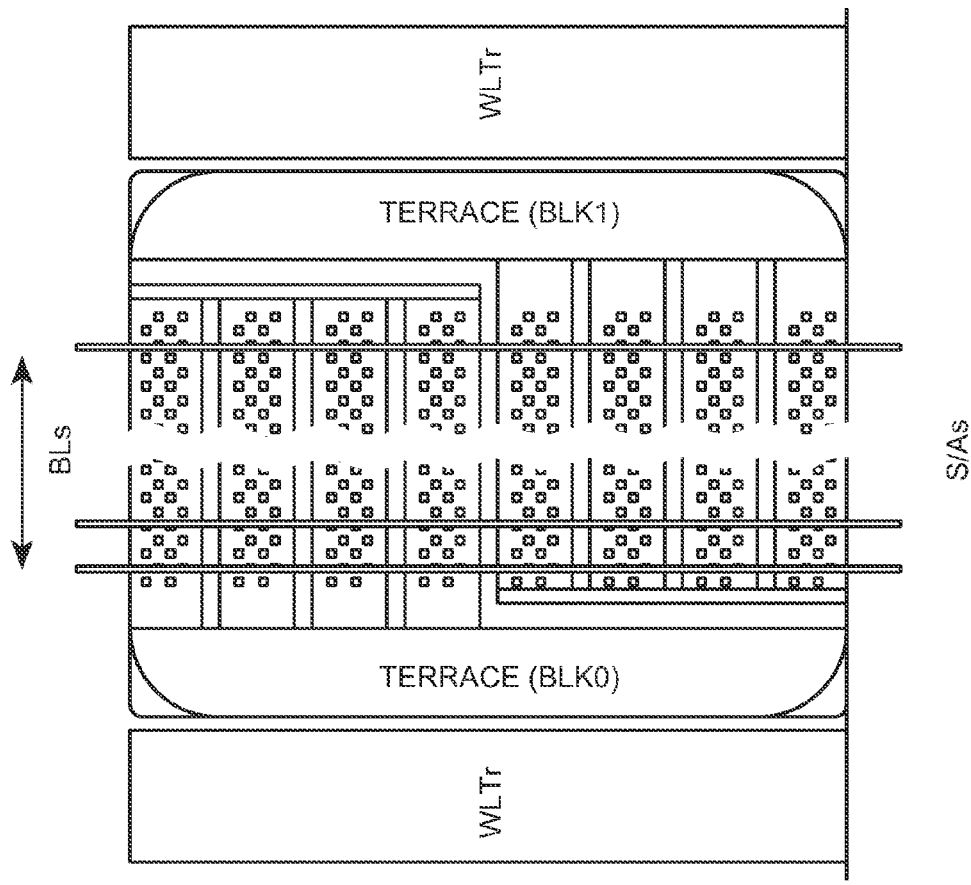

FIG. 10 shows a top view of the structure for two blocks in the exemplary embodiment. Two blocks (BLK0 above, BLK1 below) are shown, each having four fingers that run left to right. The word lines and select gate lines of each level also run left to right, with the word lines of the different fingers of the same block being commonly connected at a "terrace" and then on to receive their various voltage level through the word line select gates at WLTr. The word lines of a given layer in a block can also be commonly connected on the far side from the terrace. The selected gate lines can be individual for each level, rather common, allowing the fingers to be individually selected. The bit lines are shown running up and down the page and connect on to the sense amp circuits, where, depending on the embodiment, each sense amp can correspond to a single bit line or be multiplexed to several bit lines.

Figure 11:
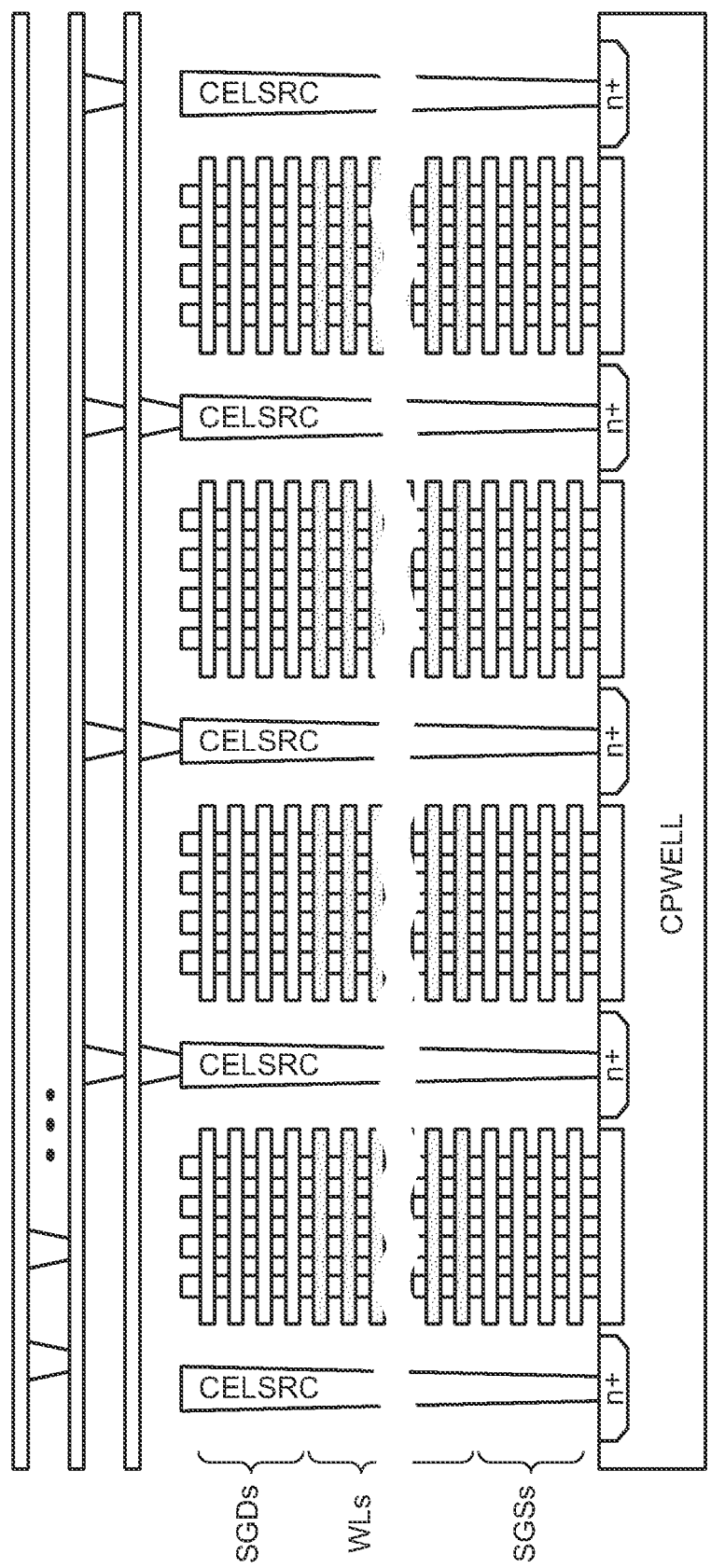

FIG. 11 shows a side view of one block, again with four fingers. In this exemplary embodiment, the select gates SGD and SGS at either end of the NAND strings are formed of four layers, with the word lines WL in-between, all formed over a CPWELL. A given finger is selected by setting its select gates to a level VSG and the word lines are biased according to the operation, such as a read voltage (VCGRV) for the selected word lines and the read-pass voltage (VREAD) for the non-selected word lines. The non-selected fingers can then be cut off by setting their select gates accordingly.

Figure 12:
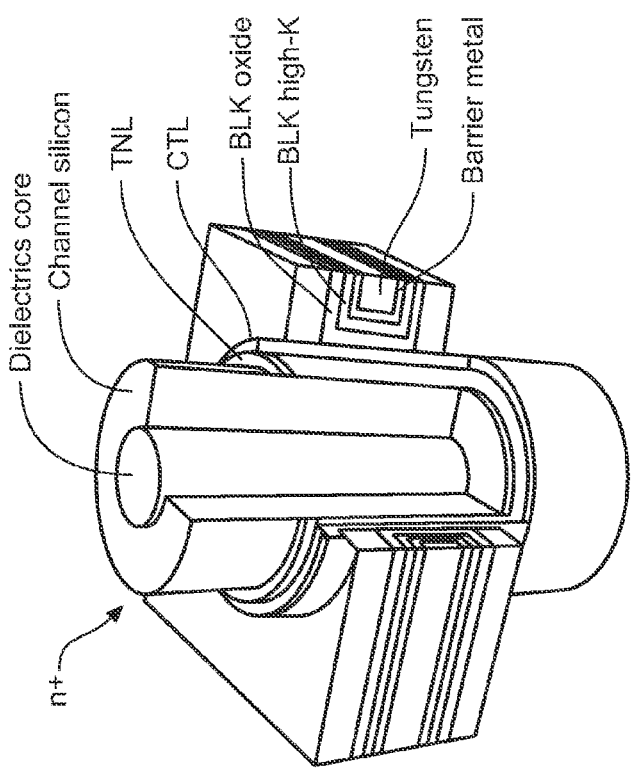

FIG. 12 illustrates some detail of an individual cell. A dielectric core runs in the vertical direction and is surrounded by a channel silicon layer, that is in turn surrounded a tunnel dielectric (TNL) and then the charge trapping dielectric layer (CTL). The gate of the cell is here formed of tungsten with which is surrounded by a metal barrier and is separated from the charge trapping layer by blocking (BLK) oxide and a high K layer.

Detection and Recording of Memory Hole-Interconnect Spacing Defects

Referring back to FIG. 10 or 11, some of the memory holes (MH) in which the NAND strings are formed are in close proximity to the local interconnects (LI), such as for the common source line CELSRC. In forming the word lines, a conducting layer, such as of tungsten, is formed around these memory holes, as illustrated in FIG. 12. Due to the narrow space involved between the memory hole and local interconnect, in some cases the conductive word line layer is not completed filled in the memory holes adjacent to an LI. As the conductive word line will then not fully surround these memory cells, they may have a slower response to program and erase operations. This section looks at techniques to identify the slow to program cells that have these defects and store this information.

Figure 13:
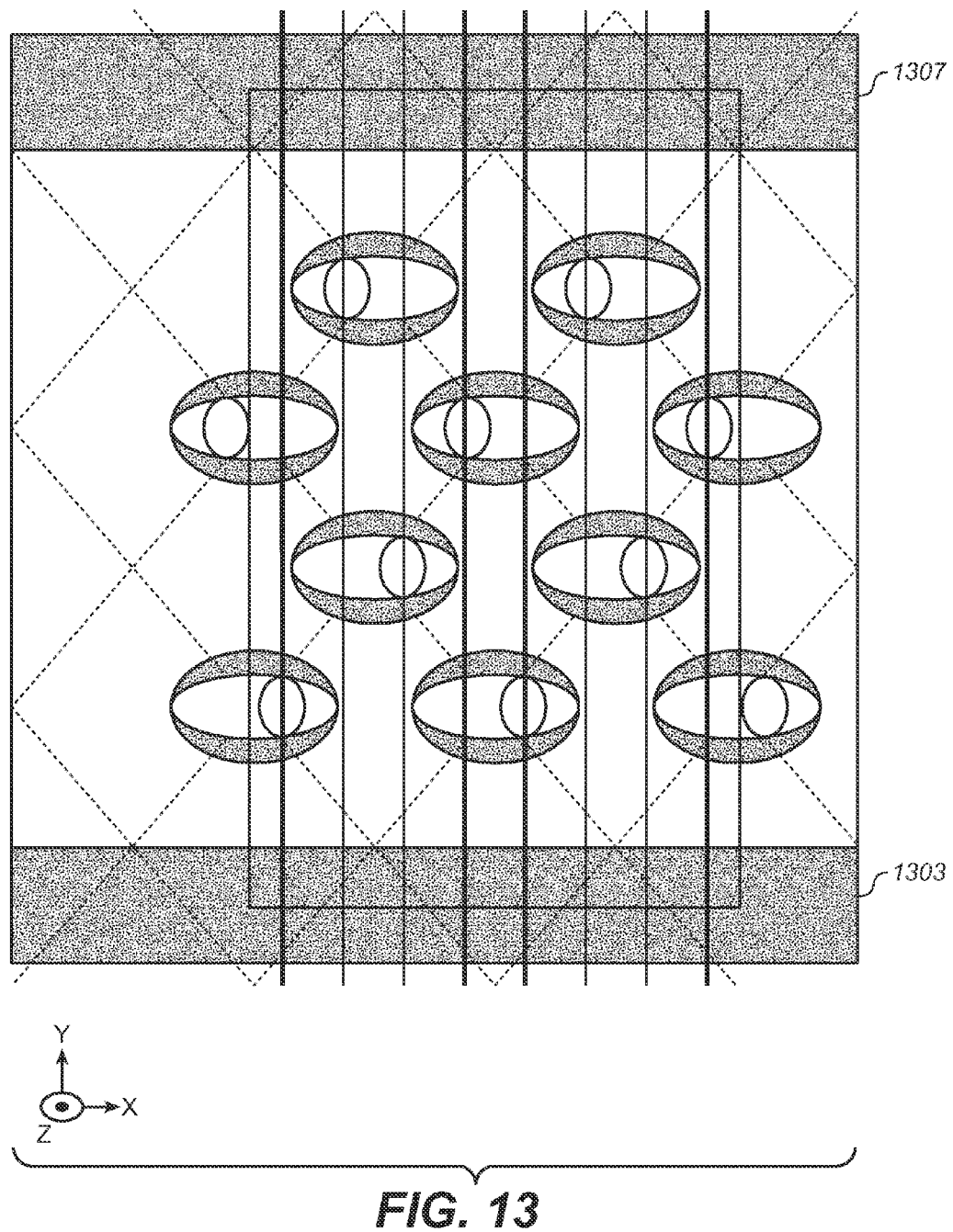
FIG. 13 is a top view of a BiCS structure detail, showing a column's worth of bit lines (running top to bottom) connected to corresponding memory cells along the word line (running right to left) of a finger between two interconnect regions.

Considering the structural background further, FIG. 13 is a top view of a BiCS structure detail, showing a column's worth of bit lines (running top to bottom) connected to corresponding memory cells along the word line (running right to left) of a finger between two interconnect regions. The memory holes include a channel region and charge trapping region (see FIG. 12) and are connected to one of the 8 bit lines of the column. (The detail shows 10 memory holes, where the lower one of the right-most memory holes and the upper one of the left-most memory holes belong to the column on either side.) The interconnect regions are at top (1301) and bottom (1303), where a pair of memory holes of each column are in proximity to one or the other of the LI regions.

Figure 14:
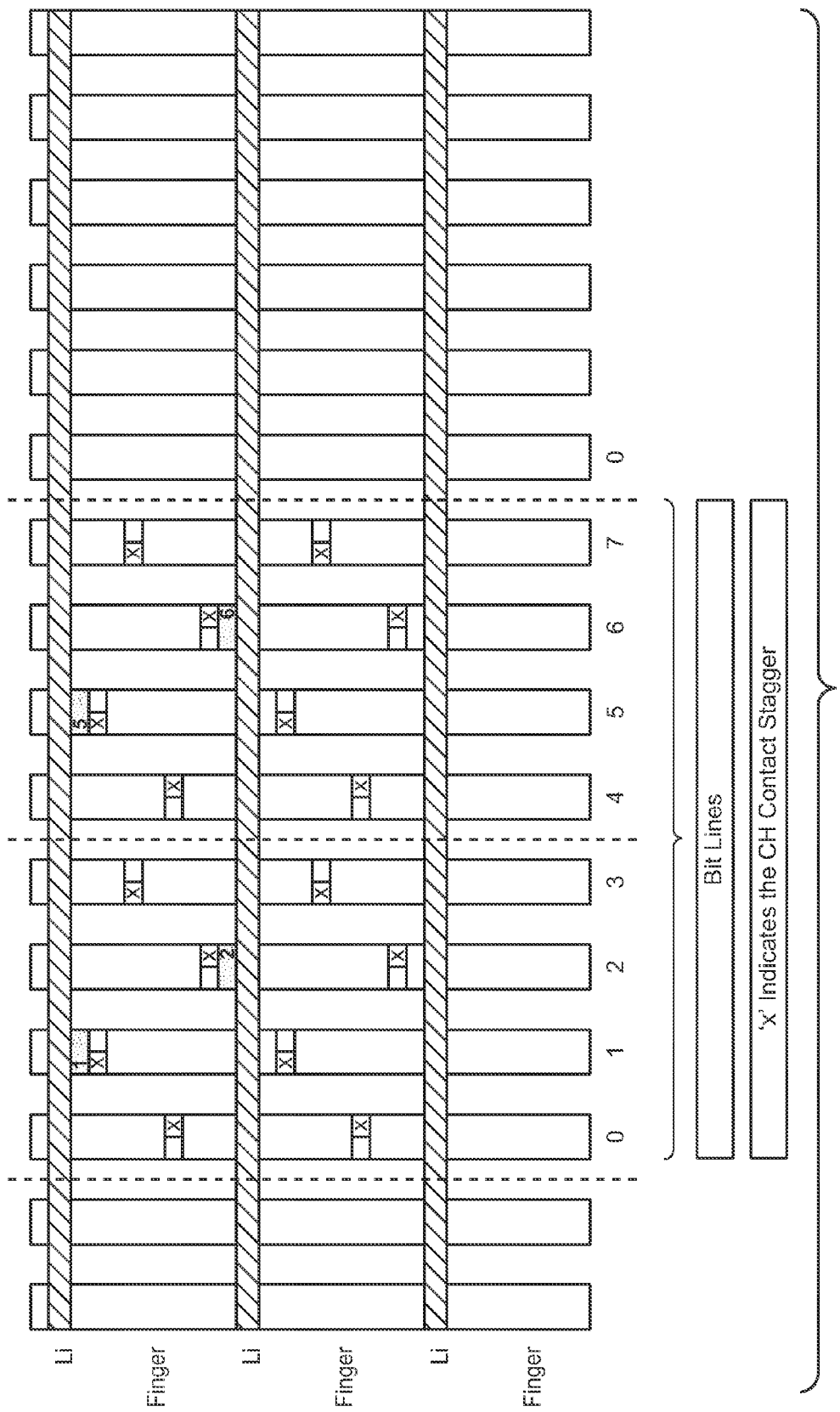
FIG. 14 is a top view diagram showing the BiCS structure where bit lines are in vertical direction on the page and word lines are in the horizontal direction.

FIG. 14 is a top view diagram showing the BiCS structure where bit lines are in vertical direction on the page and word lines are in the horizontal direction. The memory hole location is represented as x, which is the contact from the bit line to the memory hole. In this structure the memory holes are arranged in stagger position, so only some cells can have contact with an interconnect LI. The following discussion is based on the sort of stagger structure to memory holes that is periodic and based on particular word line numbers, but can readily be extended to other structure where such defects would arise. In the exemplary embodiment, the memory holes associated with bit lines 1, 2, 5 and 6 of a byte sized column (where other assignments can be used) are located at the outer side of string, close to one of the LI regions, while the cells associated with bit line numbers 0, 3, 4 and 7 are interior to the finger. Consequently, in the exemplary arrangement, for a particular byte/column only the memory cells on outer part of a finger are subject to having an LI short defect.

In a first algorithm for identifying slow cells and store the slow to program cells information, the difference in the number of programming pules, or programming loop count, is used. Referring back to bit lines 0-7 in FIG. 14, the cells on bit lines 0, 3, 4, and 7 are not adjacent to an LI and can give an indication of an expected number of programming loops. The "top" cells (as oriented on the figure) on bit lines 1 and 5 would reflect a problem with the LI above and the "bottom" cells on bit lines 2 and 6 would reflect a problem with the LI below. Programming only the inner cells using a 01100110 sequence gives a measure number of programming loop $NP_1$, where the 0 and 1 respectively correspond to program enable and program for the cells on bit lines 0-7. Programming only outer top cells using a 10111011 sequence can be used to measure a number of programming loops $NP_{OT}$, and programming only outer bottom cells using a 11011101 sequence can used to measure a number of programming loops $NP_{OB}$. (These three programming operations can be done in any convenient order.) The determination for a block can be based on a single word line's programming or for a set of word lines, where, consistency the same word line or set of would lines can be used for all of the blocks.

As slow cells will require more programming loops than normal cells, a NAND string in which defects are present for the top cells ($Def_{OT}$) will have $NP_{OT} > NP_1$ and for the bottom cells ($Def_{OB}$) if $NP_{OB} > NP_1$, where a margin of some number of counts (such as $NP_1 + 2$) can be used. The margin can be a settable parameter. To counter process variations, the comparison reference $NP_1$ can be local, with each column of a finger having its own $NP_1$ or a coarser granularity can be sued for the references: for example, to save test time, the same $NP_1$ can be used for a whole block or set of blocks or for plane.

Note that $NP_1$ can be higher if inner cells are slow to program due to some other defect, which may make it more difficult to distinguish inner from defective outer cells. Because of this, in some embodiments $NP_1$ can be calibrated to a certain number or range in order to distinguish or detect outer bad strings accurately. A value can be calibrated and one reference number be kept in a register to check that $NP_1$ has not drifted too much from block to block.

In order to capture weak strings that may not be detected at time 0, but which can degrade device operation in the field, the memory system to apply stress and then detection method to accelerate weak strings. For example, the stress can be applied with all word lines selected and the LI at 0V, or, alternately, a high voltage on the LI and the word lines on all blocks at 0V, where the well can be floated to avoid overstressing the cells.

Figure 15A:
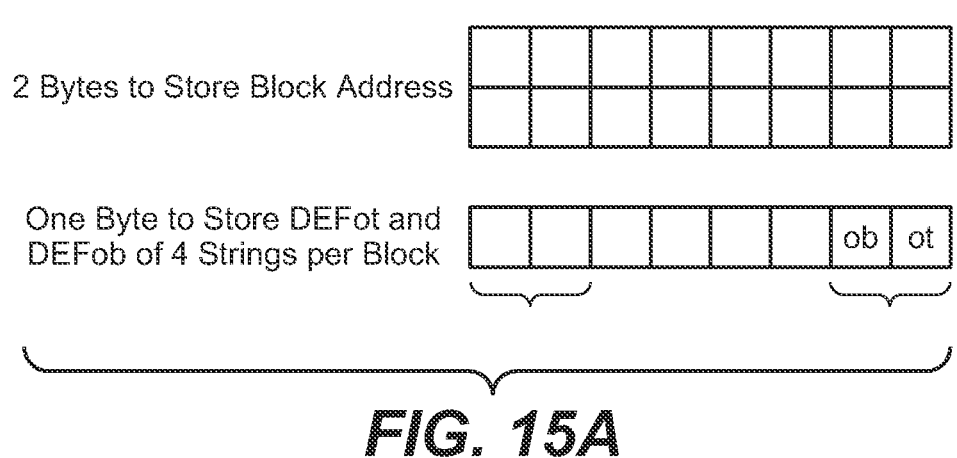
FIGS. 15A and 15B are two embodiments for storing data on slow NAND strings.

Once the slow to program strings are determined, these can be marked down as slow (bad) strings and stored for reference in, for example, a specified area of the non-volatile memory or a fuse memory or other location where they can be maintained and accessed. The result of $Def_{OT}$ or $Def_{OB}$ to mark which strings are defective can then be read out for use during program operations. This defect information can be stored in several formats. In one option, the memory can store block number and string information for only blocks that have at least one of the strings defective for either Outer_Bottom or Outter_Top. FIG. 15A is a schematic representation of this arrangement that will use, for example, two bytes of data for block address information and one byte information for 4 strings (2 bits for outer_bottom+outter_Top). The total number of Bytes required for the worst case is then for when, say, 4K blocks each having at least one string defective, or 4K BLK*3 Bytes=12 K Bytes for storing the defect information. In an exemplary embodiment, this can be accommodated in one page of non-volatile memory, although two pages may be used if redundancy or XOR check data is included due to reliability concerns.

Figure 15B:
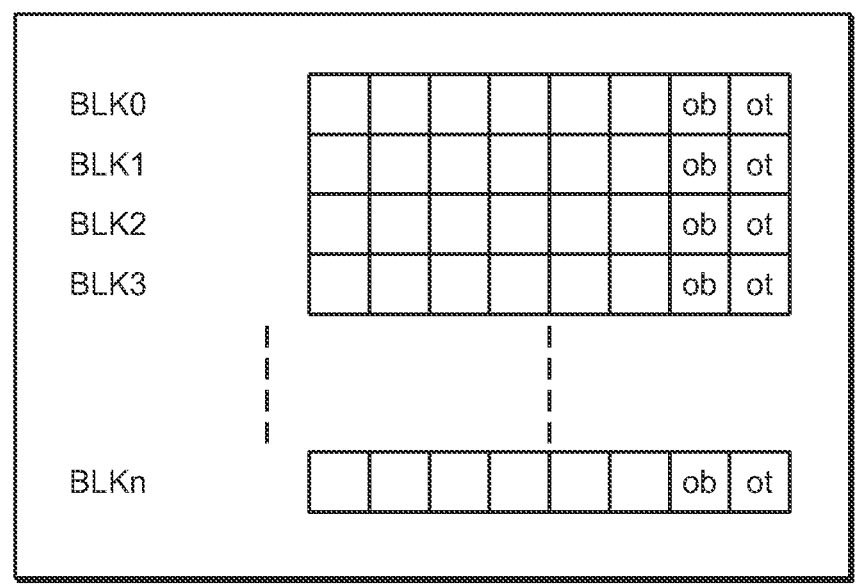

In another arrangement, the string information can be recorded for all blocks without making decision of if that block has any defected string or not, as illustrated schematically in FIG. 15B. In this embodiment, each block has one byte of information for 4 strings and 2 bits for Outer Bottom and Outer Top. For best case or worst case this would involve 4 K Bytes, for example, of information without redundancy or 8K byte with one byte redundancy. For further reliability, the information can be stored on different pages.

Another algorithm for determining NAND strings with slow to program cells be based on the cells' current (ICELL), rather than the program loop count, during the verify phase or subsequent sensing operation. In this version, inner cells are again programmed using a 0110110 sequence, but instead of a loop count, the process now measures Icell current for the inner cell programming operation ($ICELL_1$). Only the outer top cells are programmed using a 1011011 sequence and the Icell current for outer top cell programming operation ($ICELL_{OT}$) is measured; and only the outer bottom cells using a 11011101 sequence is programmed and the Icell current for the outer bottom cell programming operation ($ICELL_{OB}$) is measured. As slow cells will have a lower ICELL current than normal cells, defective NAND strings can be determined as $Def_{OT}$=if($ICELL_{OT} < ICELL_1$) or $Def_{OB}$=if ($ICELL_{OB} < ICELL_1$), where an off-set can again be included, if desired, to avoid over-characterization. The off-set can be a settable parameter. As with the program loop version, the reference value (here $ICELL_1$) can be maintained for each finger for column or with a coarser granularity, such as an average of several blocks. The result of the determination can then be recorded as discussed above as well.

A third algorithm to determine slow to program NAND strings uses a test sequence to stress and detect weak strings, where after applying a stress slow to erase strings are identified and the information is stored as described above. For the stress phase, a program stress can be applied with all word lines selected and the LI at 0V, or, alternately, a high voltage on the LI and the word lines on all blocks at 0V, where the well can be floated to avoid overstressing the cells. For the detection phase, the defect will cause strings to be resistive and slow to erase. After the die, or a selected set of blocks, is stressed, the detection phase begins with the blocks the blocks being tested. For example, if a flash write mode is available, the blocks can all be written with "00" data, for example. A shallow erase block-by-block test is then performed, after which a read with "FF" (erased) data is performed to determine which strings were slow to erase. Alternately, the decision can be made based on string current measurements. The block numbers and slow strings information can then be recorded as above.

An alternate detection is for the cells on the different NAND strings being tested to be programmed by a fixed number of pulses to, for example, the highest data state (such as "3" in FIG. 7A). The cell current ICELL can then be measured to find the slow strings relative to the normal strings. Use of a higher state will more clearly differentiate the NAND strings from the normal. For example, as part of the device characterization process, the number of pulses needed to program a fast to program cell to a give state, such as the highest or a relatively high state, can be determined. This number of pulses can then be applied along a word line (or done for a set of word lines) and then the different NAND strings can be checked for their relative level of programming, such as by applying a read voltage along the word line and looking at the relative current amounts, or by determining the different voltage levels that need to be applied for the strings to conduct.

Figure 16:
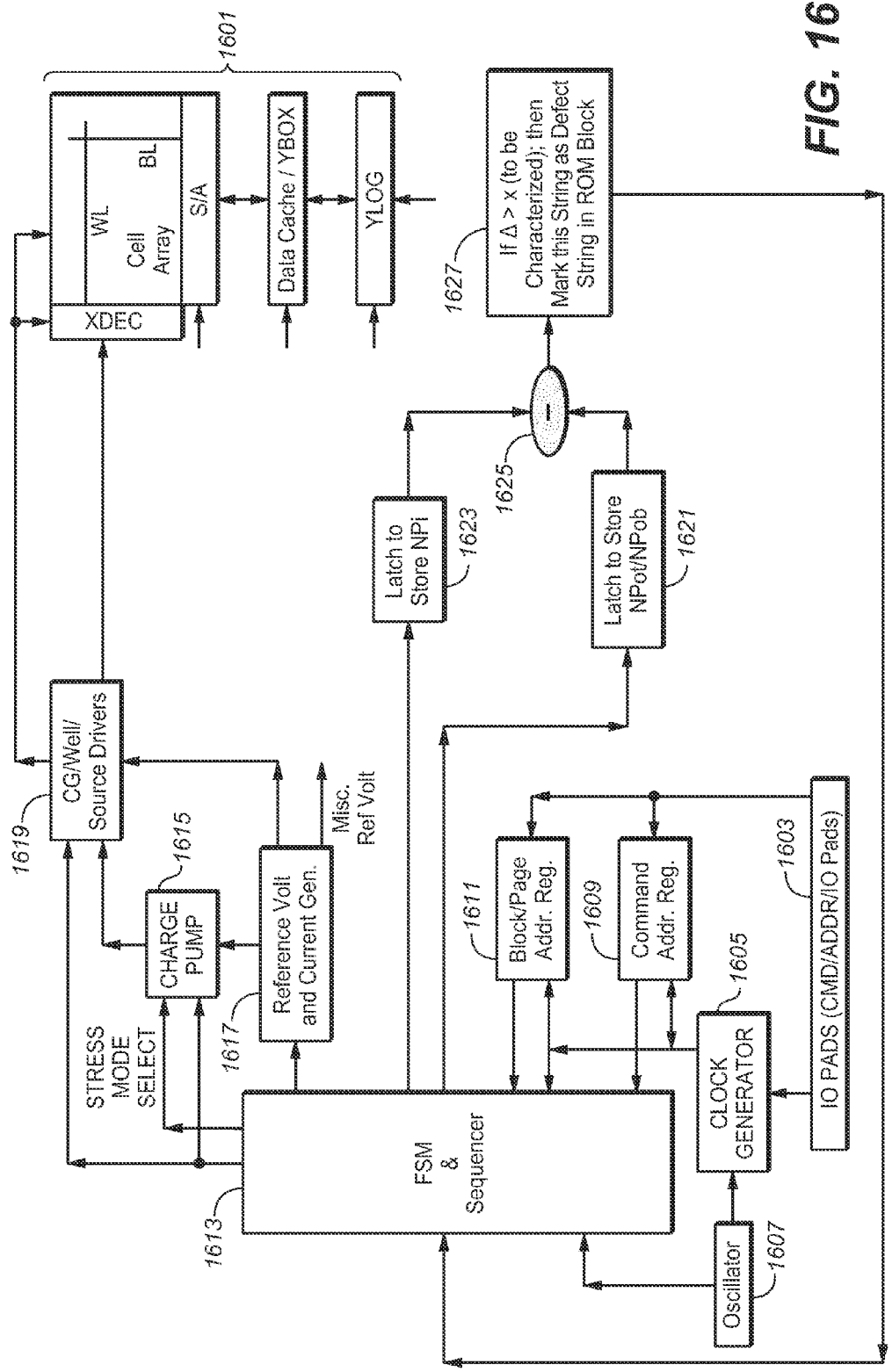
FIG. 16 is block diagram of some of the elements of the memory circuit for implementing one exemplary embodiment.

FIG. 16 is block diagram of some of the elements of the memory circuit for implementing the various embodiments described above. The array and peripheral elements are at 1601. The 10 pads are at 1603, the address and command registers at 1609 and 1611, and the clock generator and oscillator at 1605 and 1607. A finite state machine and sequencer 1613 serves as the on-chip control circuitry for the reference voltage and current generating circuitry 1617, charge pump circuits 1615, and drivers 1619. Some of the elements involved in determining slow to program NAND strings are shown at lower right. Latches for the inner strings loop count and outer strings loop count are respectively shown at 1623 and 1621. These are then compared at 1625, with decision and recordation then represented at 1627. Although shown separately for the purposes of this discussion, the elements 1621, 1623, 1625, 1627 can variously be incorporated into the other control circuitry and logic of the memory chip.

Methods to Improve Programming of Slow Cells

This section looks at methods to improve the programming of slow cells. Although this will discussed primarily in the context of BiCS types which have defects in tungsten deposition leading to memory hole to LI shorts, such as discussed in the last section, the techniques are generally applicable. In particular, the various techniques described below can be applied to the various 2D and 3D non-volatile memories described in earlier sections as well as for other memories that use similar programming techniques.

As a first step, before doing a program or erase operation, the memory will determine if a selected string in a selected blocks is slow to program. This can be done be reading the listing of these defects, such as described in the last section, and checking the corresponding byte and mark the selected string bits for $Def_{OT}$ or $Def_{OB}$. In the exemplary embodiments, depending on the defective bit information, either bit lines 1, 5, bit lines 2, 6, or all of bit lines 1, 2, 5 and 6 are applied with countermeasure. If any Def-bits are zero then those cells will be treated as a normal block.

In a first technique, the memory selectively supplies a different bit line bias to selected slow to program cells, such as a negative bias that can be provided from an extra pump, if such voltages are not already available on the device. This manipulation of bit line voltages allows the memory to change effective VPGM voltage for the slow cell. This is illustrated schematically in FIG. 17.

Figure 17:
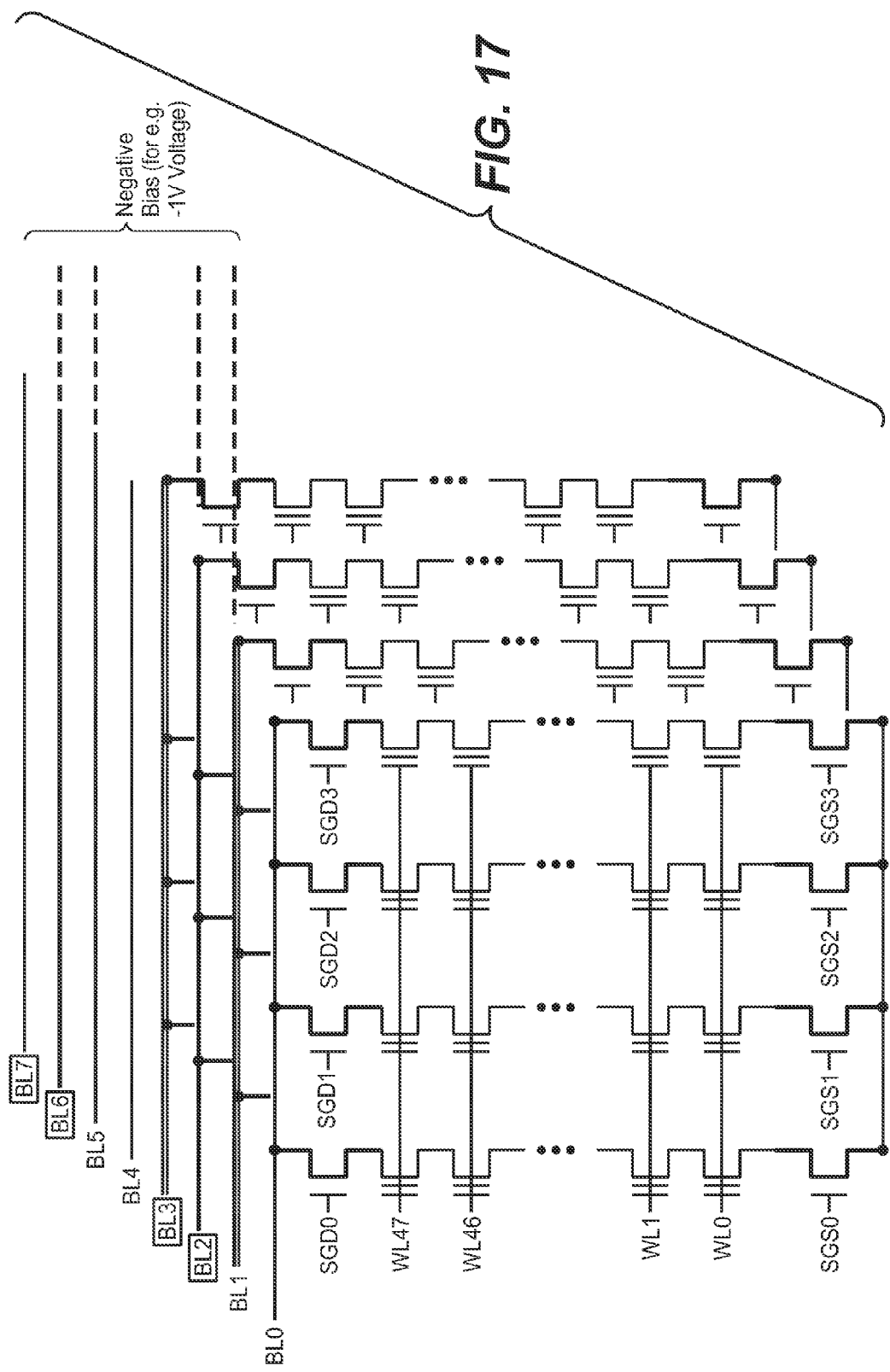
FIG. 17 shows a column of bits lines running across the top of the four fingers of a block, where the NAND strings are represented for the first four bit lines.

FIG. 17 shows a column of bits lines (BL0-7) running across the top of the four fingers of a block, where the NAND strings are represented for the first four bit lines. In the case that the outer bits lines (BL1, BL2, BL5, BL6) are slow to program and selected, this can have an "enhanced" program enable voltage of a negative bias (for e.g., −1V voltage) applied, rather than a typical program enable voltage of ∼0V for selected, but normal (that is, not marked as slow) cells. Non-selected (or verified) cells of either type would have a program inhibit voltage, such as a few volts, sufficient to turn off the drain side select gate.

Figure 18:
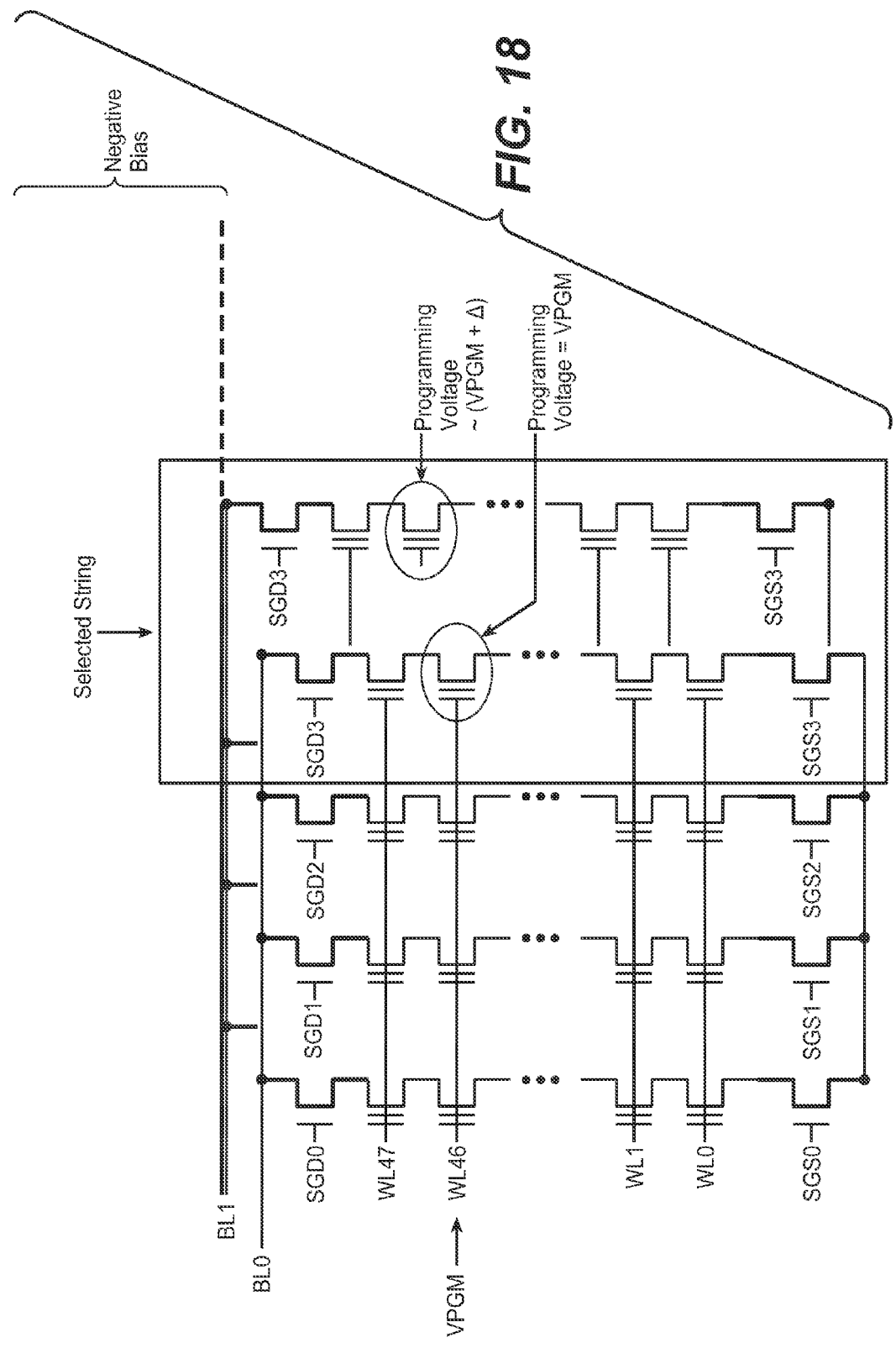
FIG. 18 looks at a selected string for BL0 and BL1, where an enhanced enable level of a negative bias is applied to BL1.

FIG. 18 looks at a selected string for just BL0 and BL1, where the string for BL0 is slow. An enhanced enable level of a negative bias is applied to BL1, while a normal program enable bias such as 0V is applied on BL0. A programming pulse of VPGM is then applied on the selected word line (WL46 in the example). The cell on WL46, BL0 will see the programming voltage=VPGM, while the cell on WL46, BL1 will see a programming voltage∼(VPGM+Δ) due to the negative bit line bias. The effective increase Δ of the programming voltage helps the slow to program cells to program more quickly.

Figure 19:
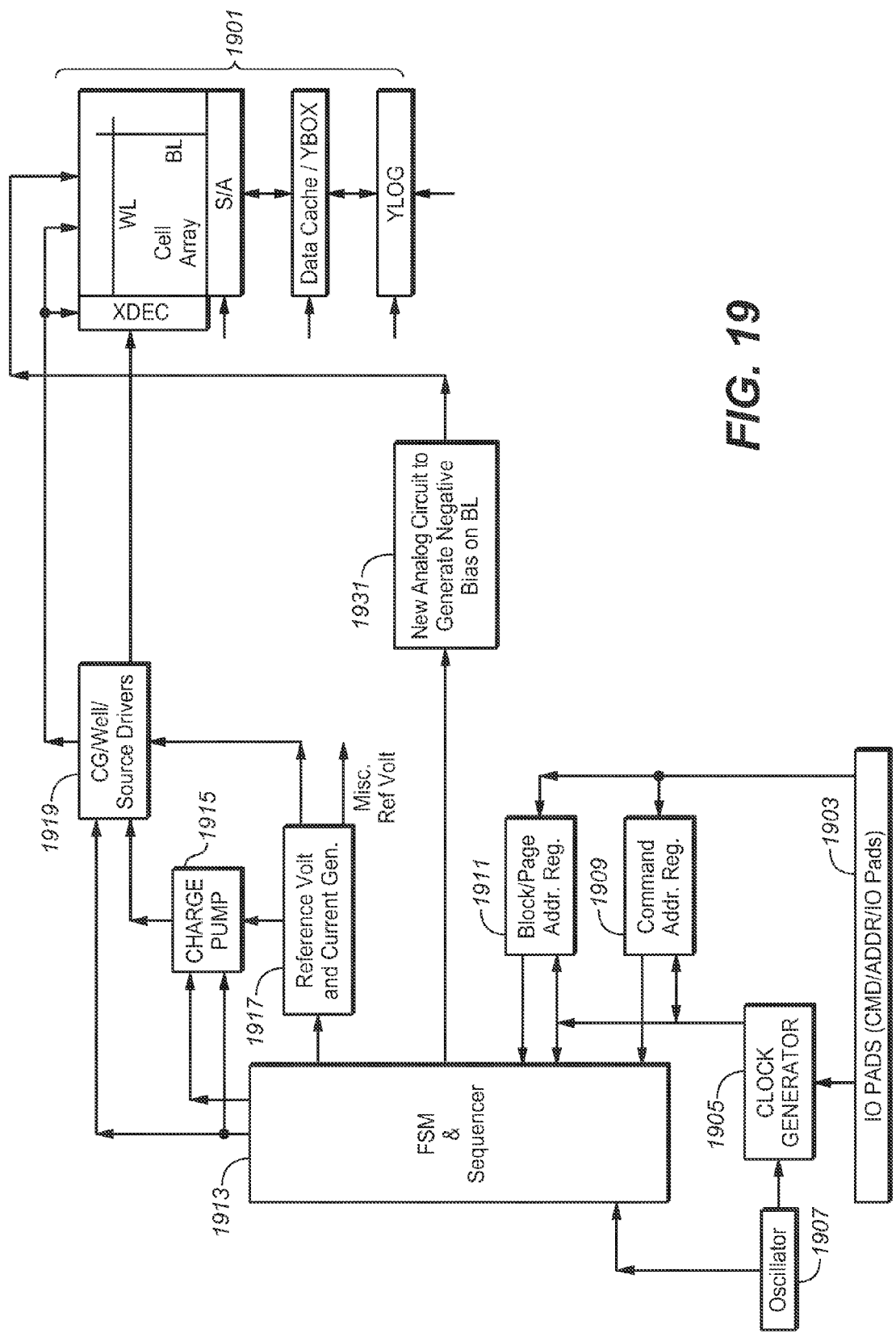
FIG. 19 is a block diagram to illustrate some of the elements involved in the embodiment of FIG. 18.

FIG. 19 is a block diagram to illustrate some of the elements involved. FIG. 19 repeats many of the same elements as in FIG. 16, where these are similarly numbered. The circuitry now also include an analog circuit to generate the negative bias levels for use on the slow bit lines, where this is show separate from the other charge pump elements for purposes of this discussion.

Figure 20:
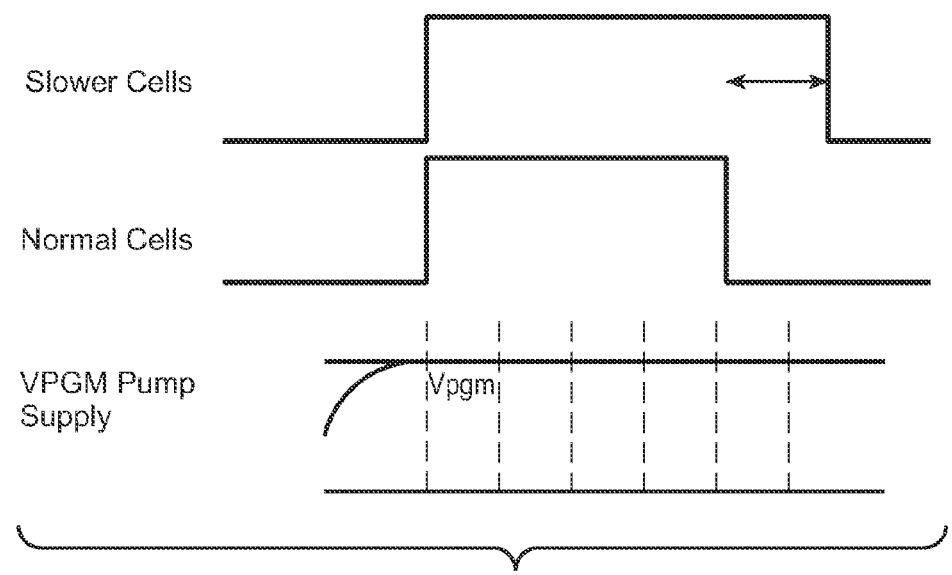
FIG. 20 schematically illustrates using a longer programming pulse for slow cells at top and a shorter pulse is applied to the normal cells.
Figure 21:
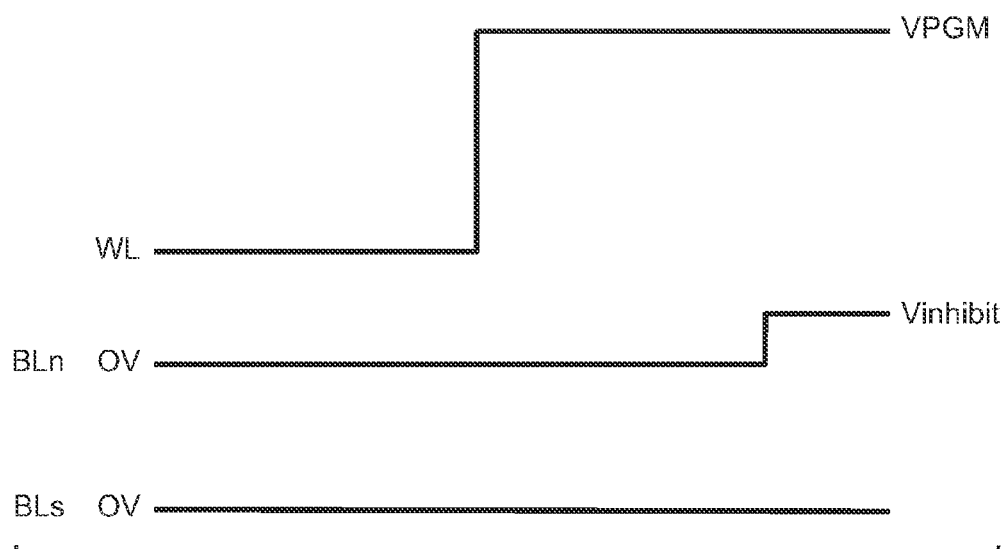
FIG. 21 represents bit line levels to provide the effect programming pulses of FIG. 20.

Another option for improving the programming rate of slow cell is through use of an elongated programming time for the pulse applied to the slow cells, relative to the pulse length for normal cells. This is illustrated schematically in FIG. 20, where an actual programming pulse is shown at bottom, a longer pulse is applied to the slow cells at top, and a shorter pulse is applied to the normal cells at center. Any outer slow cells will get extra timing for programming, while the faster cells (inner cells) will receive less. As all of the cells on the same word line will receive the same pulse, however, the pulse length itself is not shortened; rather, the memory selectively inhibits faster cells earlier and slower cells will be applied VPGM for little more time. This is illustrated schematically in FIG. 21, where the pulse along the word line is at top. For a selected slow cell, the bit lines (BLs at bottom) stay at the program enable voltage (0V). For a selected normal cell, however, the bit line (BLn, center) is initially at the program enable level, but then raised to the inhibit voltage Vinhibit.

For example, suppose the main programming pulse is applied for four clock cycles in a standard write that would not account for the slow cells. Instead, a longer, say 6 cycle, program pulse is used. Then all the faster cells will be cut-off after for cycles, but the slower cells will be applied the programming pulse for all 6 clock cycles in each pulse until the cell verifies (or reaches the maximum number of loops).

A further option is the use of a dummy programming pulse to push slower cells higher. For example, a memory typically will allow for some number of failed bits in a program operation, a normal case Bit Scan Pass Fail criterion BSPF. Base on the presence of slow cells, the $Def_{OT}$ or $Def_{OB}$ value in the exemplary embodiment, if one of these bits is higher the memory can use a new BSPF=N×BSPF, for some factor N, and if both bits are use a new BSPF=2N×BSPF, where N can be determined as part of device characterization. Once the chosen BSPF criteria is passed, the memory can inhibit all cells which passed the corresponding program verify level and then can apply some number of dummy (without verify) program pulses with a higher VPGM or with wider pulse width to push Vt of slow cells higher. This is illustrated with respect to FIGS. 22-25.

Figure 22:
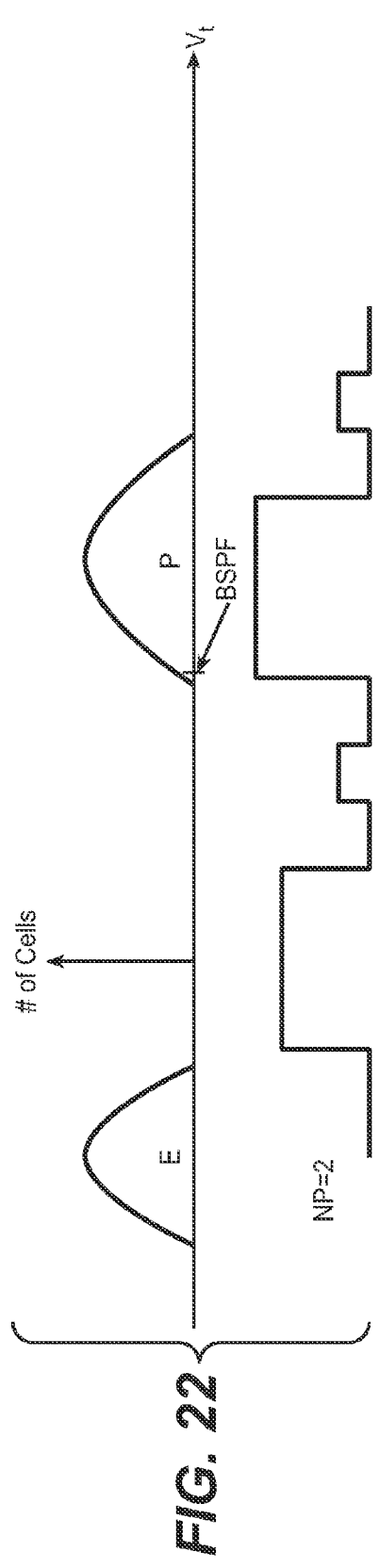
FIGS. 22-25 illustrate a technique for the memory to apply some number of dummy (without verify) program pulses with a higher VPGM or with wider pulse width to push Vt of slow cells higher.

FIG. 22 looks at a set of normal cells' threshold voltages (Vt) distribution and number of programming pulses. The two distributions correspond to an erased state E and a programmed state P. The programming waveform applied to a selected waveform is shown to have two pulses (NP=2) in the pulse staircase, each followed by a verify operation of the P state. In this example, the selected cells program to the P state after two pulse, except for a few below the BSPR point. If there is no defect present in any of the cells, the cells will behave more or less identically, as shown in FIG. 22 where the Vt of normal cells are shifted correctly for all the cells and there are very few slow cells which are below the BSPF level.

Figure 23:
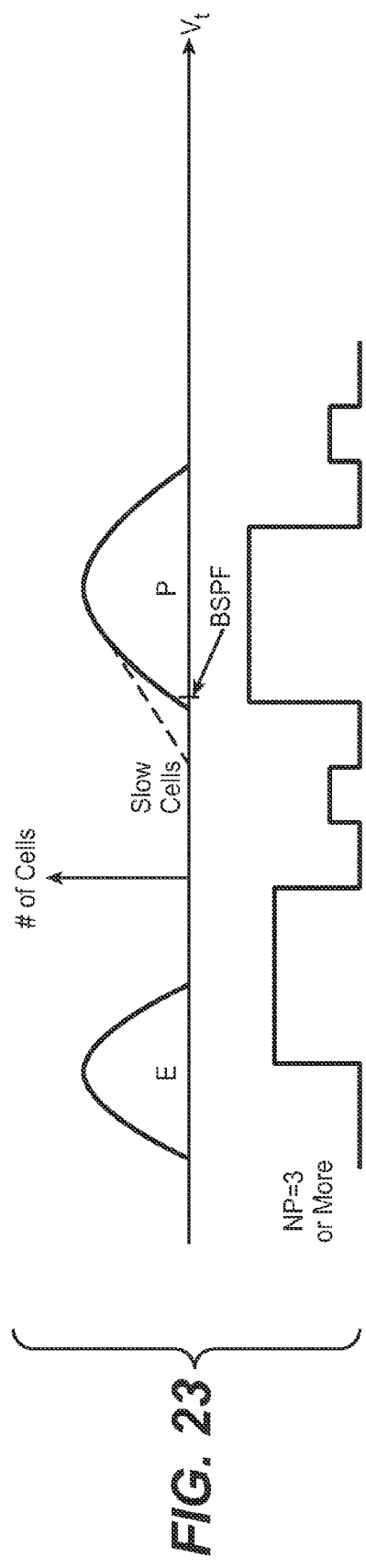

FIG. 23 illustrates the situation when there are both slow and normal cells. If there some defected cells are present in the string, then those cells will response slowly to programming and erase pulses, as illustrated by the broken line in the lower end tail of the P state distribution after NP=2. To overcome this lower tail in the P state Vt distribution, the memory needs to apply one or more additional programming pulse to pass the programming operation.

Figure 24:
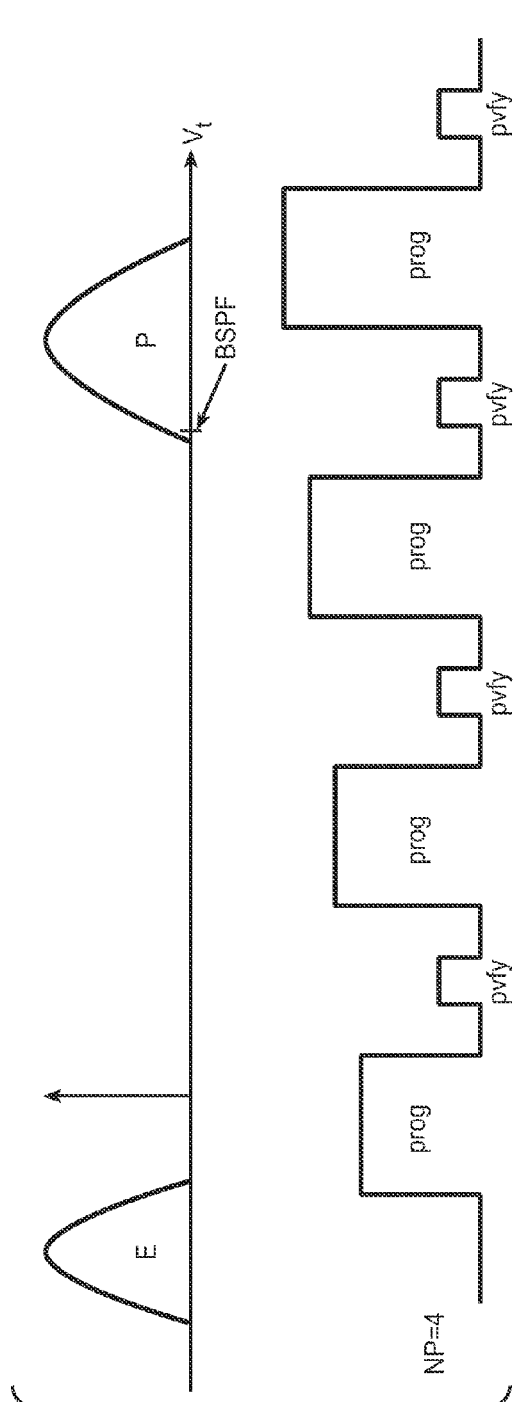
Figure 25:
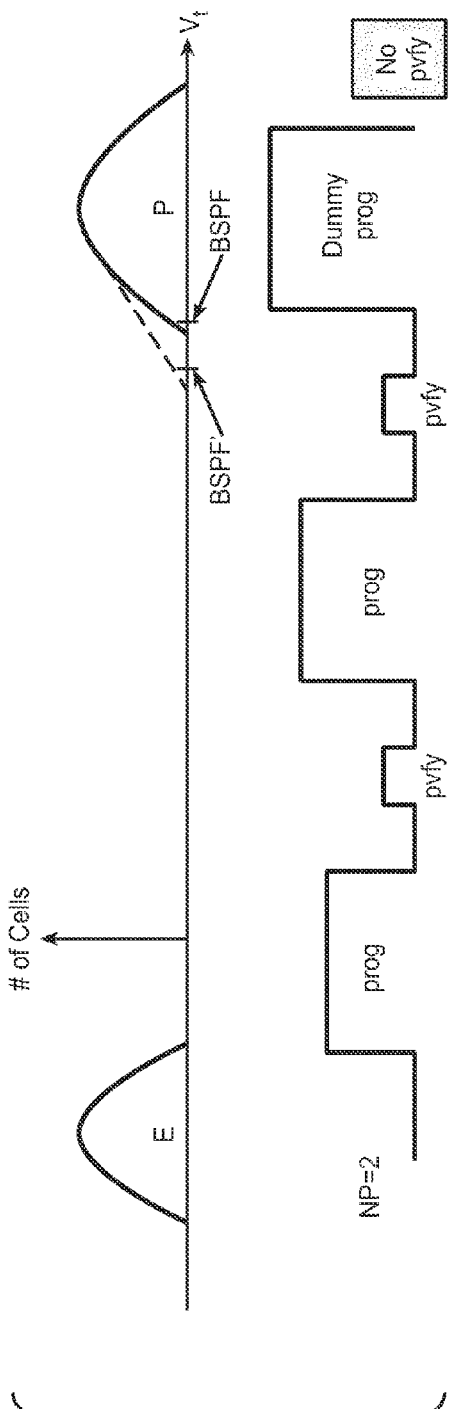

As shown in the Vt distribution FIG. 24, if the memory keeps the same BSPF, it will require more program loops including program lock out and verify to bring enough of the slow cells above the BSPF level and meet the criterion. Consequently, this will impact the device's performance.

To improve upon this situation, the BSPF criterion is increased as explained earlier, so the even though many of the programming cells have not passed the actual (non-modified) BSPF criterion, the memory considers the programming algorithm as passed. After this passing the (relaxed) BSPF criterion, the memory can apply one or more dummy programming pulse with higher VPGM value or for a longer duration. An example of this is illustrated by the write waveform of FIG. 25.

As shown in the Vt distribution, after two normal programming pulses the P state distribution meets the relaxed BSPF criterion. The slow cell are then given an additional, larger dummy pulse, without a subsequent verify or lockout operation.

CONCLUSION

The foregoing detailed description has been presented for purposes of illustration and description. It is not intended to be exhaustive or to limit the above to the precise form disclosed. Many modifications and variations are possible in light of the above teaching. The described embodiments were chosen in order to explain the principles involved and its practical application, to thereby enable others to best utilize the various embodiments and with various modifications as are suited to the particular use contemplated. It is intended that the scope be defined by the claims appended hereto.

It is claimed:

1. A method of operating a non-volatile memory circuit having an array of a plurality of programmable memory cells formed along bit lines and word line, the method comprising:
   maintaining a record of memory cells of the array that are slow to program;
   performing a programming operation for memory cells on a selected word line, the programming operation including:
      determining from the record cells on the selected word line that are slow to program;
      applying a pulse on the selected word line; and
      prior to applying the pulse on the selected word line, biasing the bit lines corresponding to the memory cells along the selected word line, the biasing comprising:
         for memory cells along the selected word line not to be programmed, setting a programming inhibit voltage on the corresponding bit lines;
         for memory cells along the selected word line that are to be programmed and that are not slow to program memory cells, setting a program enable voltage on the corresponding bit lines; and
         for slow to program memory cells along the selected word line that are to be programmed, setting an enhanced program enable voltage on the corresponding bit lines, wherein the program enable voltage is a voltage intermediate to the program inhibit voltage and the enhanced program enable voltage.

2. The method of claim 1, wherein the programming inhibit voltage is a positive voltage and the enhanced program enable voltage is a negative voltage.

3. The method of claim 2, wherein the program enable voltage is ground.

4. The method of claim 1, wherein the programming operation further comprises:
   subsequent to applying the pulse on the selected word line, performing a verify operation to determine memory cells along the selected word line that are to be programmed that verify as being successfully programmed;
   for those of the memory cells along the selected word line that are to be programmed determined to be successfully programmed, setting a programming inhibit voltage on the corresponding bit lines; and
   applying an additional pulse on the selected word line.

5. The method of claim 1, wherein the memory circuit is a monolithic three-dimensional semiconductor memory device where the memory cells are arranged in multiple physical levels above a silicon substrate and comprise a charge storage medium.

6. The method of claim 1, wherein the memory circuit is a monolithic two-dimensional semiconductor memory device where the memory cells are arranged in a single physical level above a silicon substrate and comprise a charge storage medium.

7. A method of operating a non-volatile memory circuit having an array of a plurality of programmable memory cells formed along bit lines and word line, the method comprising:
   maintaining a record of memory cells of the array that are slow to program;
   performing a programming operation for memory cells on a selected word line, the programming operation including:
      determining from the record cells on the selected word line that are slow to program;
      biasing the bit lines corresponding to the memory cells along the selected word line, the biasing comprising:
         for memory cells along the selected word line not to be programmed, setting a programming inhibit voltage on the corresponding bit lines; and
         for memory cells along the selected word line that are to be programmed, setting a program enable voltage on the corresponding bit lines; and
      applying a first pulse on the selected word line,
      wherein for slow to program memory cells along the selected word line that are to be programmed, the corresponding bit lines are maintained at the program enable voltage for the duration of the first pulse, and
      where for memory cells along the selected word line that are to be programmed and that are not slow to program memory cells, the corresponding bit lines are switched from the program enable voltage to the program inhibit voltage during the first pulse.

8. The method of claim 7, wherein the programming operation further includes:
   subsequent to applying the first pulse on the selected word line:
      performing a verify operation for memory cells along the selected word line to determine memory cells not to be programmed for a subsequent, second pulse applied on the selected word line.

9. The method of claim 7, wherein the programming operation further includes:
   prior to applying the first pulse on the selected word line:
      biasing the bit lines corresponding to the memory cells along the selected word line, the biasing comprising:

for memory cells along the selected word line not to be programmed, setting a programming inhibit voltage on the corresponding bit lines; and for memory cells along the selected word line that are to be programmed, setting a program enable voltage on the corresponding bit lines; and applying a second pulse on the selected word line, wherein for memory cells along the selected word line that are to be programmed, the corresponding bit lines are maintained at the program enable voltage for the duration of the second pulse.

10. The method of claim 7, wherein the programming inhibit voltage is a positive voltage.

11. The method of claim 7, wherein the program enable voltage is ground.

12. The method of claim 7, wherein the memory circuit is a monolithic three-dimensional semiconductor memory device where the memory cells are arranged in multiple physical levels above a silicon substrate and comprise a charge storage medium.

13. The method of claim 7, wherein the memory circuit is a monolithic two-dimensional semiconductor memory device where the memory cells are arranged in a single physical level above a silicon substrate and comprise a charge storage medium.

14. A method of operating a non-volatile memory circuit having an array of a plurality of programmable memory cells formed along bit lines and word line, the method comprising:

maintaining a record of memory cells of the array that are slow to program; and writing a page of data along a selected word line, including:

performing an alternating series pulse and verify operations for the memory cells along the selected word line until the page of data is determined to be successfully written, wherein memory cell along the selected word line that verify as written to a corresponding target state are inhibited from further programming;

subsequently determining whether any memory cells along the selected word line that have failed to verify and that are listed in the record as slow to program; and subsequently applying an additional pulse to the selected word line with all of the memory cells inhibited from further programming except the memory cells determined both to be slow to program and to have failed to verify.

15. The method of claim 14, wherein the page data is determined to be successfully written if the number of memory cells that fail to verify is below a bound.

16. The method of claim 15, the value of the bound is higher if the selected word line includes memory cells that are slow to program.

17. The method of claim 14, wherein, during a pulse operation bit lines corresponding to memory cells to be programmed are set to a program enable voltage, bit lines corresponding to memory cells not to be programmed are set to a program inhibit voltage, and a programming voltage pulse is applied to the selected word line.

18. The method of claim 17, wherein the programming inhibit voltage is a positive voltage.

19. The method of claim 17, wherein the program enable voltage is ground.

20. The method of claim 14, wherein the memory circuit is a monolithic three-dimensional semiconductor memory device where the memory cells are arranged in multiple physical levels above a silicon substrate and comprise a charge storage medium.

21. The method of claim 14, wherein the memory circuit is a monolithic two-dimensional semiconductor memory device where the memory cells are arranged in a single physical level above a silicon substrate and comprise a charge storage medium.

* * * * *